(12) United States Patent
Fujikawa et al.

(10) Patent No.: US 8,760,223 B2
(45) Date of Patent: Jun. 24, 2014

(54) SWITCHING CIRCUIT

(75) Inventors: Kazuhiro Fujikawa, Osaka (JP); Nobuo Shiga, Osaka (JP); Takashi Ohira, Toyohashi (JP); Kazuyuki Wada, Toyohashi (JP); Kazuya Ishioka, Toyohashi (JP); Hiroshi Ishioka, legal representative, Iwaki (JP)

(73) Assignees: Sumitomo Electric Industries, Ltd., Osaka-shi (JP); National University Corporation Toyohashi University of Technology, Toyohashi-shi (JP)

( * ) Notice: Subject to any disclaimer, the term of this patent is extended or adjusted under 35 U.S.C. 154(b) by 0 days.

(21) Appl. No.: 13/490,101

(22) Filed: Jun. 6, 2012

(65) Prior Publication Data

US 2012/0306563 A1    Dec. 6, 2012

Related U.S. Application Data

(60) Provisional application No. 61/493,823, filed on Jun. 6, 2011.

(30) Foreign Application Priority Data

Jun. 6, 2011  (JP) ................................. 2011-126337

(51) Int. Cl.
*H02M 3/07* (2006.01)
(52) U.S. Cl.
USPC ............ 327/587; 327/494; 327/423; 327/382
(58) Field of Classification Search
USPC .................. 327/587, 588, 494–497, 423, 382
See application file for complete search history.

(56) References Cited

U.S. PATENT DOCUMENTS 4,533,836 A * 8/1985 Carpenter et al. ............... 307/11
4,811,192 A * 3/1989 Egawa .......................... 363/132
6,118,985 A * 9/2000 Kawakyu et al. ............... 455/78

(Continued)

FOREIGN PATENT DOCUMENTS

JP    H7-047993    11/1995
JP    2002-171139   6/2002

(Continued)

OTHER PUBLICATIONS

International Preliminary Report on Patentability and Written Opinion in PCT International Application No. PCT/JP2012/058991, dated Dec. 27, 2013.

*Primary Examiner* — Thomas J Hiltunen
(74) *Attorney, Agent, or Firm* — Venable LLP; Michael A. Sartori; F. Brock Riggs

(57) ABSTRACT

A switching circuit according to one embodiment is a switching circuit including at least one semiconductor switch element having an input, output, and a common terminals, a pulse-like signal being applied between the input and common terminals to switch a current between the output and common terminals. The switching circuit further includes a capacitance suppression element section connected at least one of between the input and output terminals, between the input terminal common terminals, and between the output and common terminals. The capacitance suppression element section reduces a parasitic capacitance between the terminals of the semiconductor switch element where the capacitance suppression element section is connected to less than that obtained when the capacitance suppression element section is not connected at a frequency N times (N is an integer of 1 or more) as high as a clock frequency of the pulse-like signal.

11 Claims, 19 Drawing Sheets

(56) References Cited

U.S. PATENT DOCUMENTS

| | | | |
|---|---|---|---|
| 6,320,775 B1 * | 11/2001 | Ito et al. | 363/132 |
| 6,377,095 B1 * | 4/2002 | Kuo | 327/170 |
| 7,633,357 B2 * | 12/2009 | Hangai et al. | 333/103 |
| 8,246,133 B2 * | 8/2012 | Oshima et al. | 347/9 |
| 2008/0197929 A1 * | 8/2008 | Chang et al. | 330/277 |

FOREIGN PATENT DOCUMENTS

| | | |
|---|---|---|
| JP | 2005-117634 | 4/2005 |
| JP | 2005-176331 | 6/2005 |
| JP | 2007-336048 | 12/2007 |
| JP | 2010-028522 | 2/2010 |

* cited by examiner

SWITCHING CIRCUIT

CROSS-REFERENCE TO RELATED APPLICATIONS

This application claims priority to Provisional Application Ser. No. 61/493,823, filed on Jun. 6, 2011 and claims the benefit of Japanese Patent Application No. 2011-126337, filed on Jun. 6, 2011, all of which are incorporated herein by reference in their entirety.

BACKGROUND

1. Field

Embodiments of the present invention relate to a switching circuit.

2. Description of the Related Art

There are known switching circuits using semiconductor switch elements such as transistors (See Japanese Utility Model Publication No. Hei-07-47993). Since parasitic capacitance exists in the semiconductor switch element due to its configuration, a charge and discharge time of the parasitic capacitance is required when the semiconductor switch element performs a switching operation. As a method for reducing the charge and discharge time of the parasitic capacitance, the semiconductor switch element is overdriven in Japanese Utility Model Publication No. Hei-07-47993.

SUMMARY

In the overdrive, however, it is necessary to supply more voltage (or more current) than is required to drive the semiconductor switch element. Thus, the semiconductor switch element may be damaged in some cases, and the power efficiency of the switching circuit is easily reduced.

It is an object of the present invention to provide a switching circuit which can increase a switching speed and can also improve power efficiency without performing overdrive.

A switching circuit according to one aspect of the present invention is a switching circuit including at least one semiconductor switch element having an input terminal, an output terminal, and a common terminal, a pulse-like signal being applied between the input terminal and the common terminal to switch a current between the output terminal and the common terminal. The switching circuit further includes a capacitance suppression element section connected at least one of between the input terminal and the output terminal, between the input terminal and the common terminal, and between the output terminal and the common terminal. The capacitance suppression element section reduces a parasitic capacitance between the terminals of the semiconductor switch element where the capacitance suppression element section is connected to less than that obtained when the capacitance suppression element section is not connected at a frequency N times (N is an integer of 1 or more) as high as a clock frequency of the pulse-like signal.

A switching circuit according to another aspect of the present invention is a switching circuit including four semiconductor switch elements each having an input terminal, an output terminal, and a common terminal, an output terminal of a first semiconductor switch element out of the four semiconductor switch elements and an output terminal of a third semiconductor switch element out of the four semiconductor switch elements being connected to each other, a common terminal of a second semiconductor switch element out of the four semiconductor switch elements and a common terminal of a fourth semiconductor switch element out of the four semiconductor switch elements being connected to each other, a common terminal of the first semiconductor switch element and an output terminal of the second semiconductor switch element being connected to each other, a common terminal of the third semiconductor switch element and an output terminal of the fourth semiconductor switch element being connected to each other, and a pulse-like signal being applied to each input terminal of the first to fourth semiconductor switch elements such that the second and third semiconductor switch elements are in an OFF state when the first and fourth semiconductor switch elements are in an ON state and the second and third semiconductor switch elements are in an ON state when the first and fourth semiconductor switch elements are in an OFF state. The switching circuit further includes a capacitance suppression element section connected at least one of between the input terminal and the output terminal, between the input terminal and the common terminal, and between the output terminal and the common terminal of at least one of the four semiconductor switch elements. The capacitance suppression element section reduces a parasitic capacitance between the terminals of the semiconductor switch element where the capacitance suppression element section is connected to less than that obtained when the capacitance suppression element section is not connected at a frequency N times (N is an integer of 1 or more) as high as a clock frequency of the pulse-like signal.

In the configuration of the switching circuit according to the one aspect and the another aspect of the present invention, the influence of the parasitic capacitance itself existing in the semiconductor switch element is reduced by the capacitance suppression element section. Accordingly, a switching speed can be increased, and power efficiency can be improved without performing overdrive.

The switching circuit according to the another aspect of the present invention may further include a first capacitance element connected between the output terminal of the second semiconductor switch element and the input terminal of the fourth semiconductor switch element, and a second capacitance element connected between the input terminal of the second semiconductor switch element and the output terminal of the fourth semiconductor switch element. In the aspect, the first capacitance element may have a capacitance to reduce a parasitic capacitance between the input terminal and the output terminal of the fourth semiconductor switch element to less than that obtained when the first capacitance element is not connected at a frequency N times (N is an integer of 1 or more) as high as the clock frequency of the pulse-like signal supplied to the fourth semiconductor switch element. The second capacitance element may have a capacitance to reduce a parasitic capacitance between the input terminal and the output terminal of the second semiconductor switch element to less than that obtained when the second capacitance element is not connected at a frequency N times (N is an integer of 1 or more) as high as the clock frequency of the pulse-like signal supplied to the second semiconductor switch element.

In the configuration, since the first and second capacitance elements are connected, the parasitic capacitance between the input terminal and the output terminal of each of the second and fourth semiconductor switch elements can be reduced. As a result, the switching speed can be further increased and the power efficiency can be further improved.

The pulse-like signal may be a PWM signal. In this case, the capacitance suppression element section may be configured to satisfy expressions (1) and (2) when a reactance of the capacitance suppression element section is a function $X(\omega)$ of an angular frequency.

[Expression 1]

$$jX(n\varpi_0) = -\frac{1}{jn\varpi_0 C_X}(n=1,2,\ldots,N) \quad (1)$$

[Expression 2]

$$\left|\frac{1}{jn\varpi_0 C_X + \frac{1}{jX(\varpi_M)}}\right| = \alpha R_{CO}(\alpha \gg 1) \quad (2)$$

(In the expressions (1) and (2), j represents an imaginary unit, $\omega_0$, represents a product of a clock frequency of the PWM signal and $2\pi$, $\omega_M$ represents a product of a clock frequency of the PWM signal and $2\pi$, represents a product of a modulation frequency of the PWM signal and $2\pi$, $C_X$ represents a parasitic capacitance between the terminals of the semiconductor switch element as the parasitic capacitance between the terminals of the semiconductor switch element where the capacitance suppression element section is connected, $R_{CO}$ represents an output impedance of a drive circuit that is connected to the input terminal of the semiconductor switch element where the capacitance suppression element section is connected and supplies the PWM signal.)

In the configuration, a combined impedance of the parasitic capacitance between the terminals where the capacitance suppression element section is connected and the capacitance suppression element section becomes very large in the semiconductor switch element where the capacitance suppression element section is connected. As a result, the semiconductor switch element approaches a state in which the parasitic capacitance between the terminals where the capacitance suppression element section is connected practically does not exist. The influence of the parasitic capacitance can be thereby reduced.

The function $X(\omega)$ may be expressed by an expression (3).

[Expression 3]

$$jX(\varpi) = \frac{\beta(-\varpi^2 + \varpi_{z0}^2)(-\varpi^2 + \varpi_{z1}^2)\ldots(-\varpi^2 + \varpi_{zN-1}^2)}{j\omega(-\varpi^2 + \varpi_{p1}^2)\ldots(-\varpi^2 + \varpi_{pN-1}^2)} \quad (3)$$

(In the expression (3), when t is an integer of 1 to N−1, $\omega_{z0}$ is a value that satisfies $0<\omega_{z0}<\omega_0$, $\omega_{zt}$ and $\omega_{pt}$ are values that satisfy $t\omega_0<\omega_{pt}<\omega_{zt}<(t+1)\omega_0$, and $\beta$ is any value.)

The capacitance suppression element section may be connected between the input terminal and the output terminal of the semiconductor switch element. In this case, the parasitic capacitance of the semiconductor switch element as the parasitic capacitance between the input terminal and the output terminal can be reduced by the capacitance suppression element section.

N may be 2 or more. In this case, the capacitance suppression element section may have first to N-th circuit sections connected in series. Moreover, the first circuit section may be composed of an inductance element and a capacitance element connected in series, and an i-th circuit section (i is an integer of 2 to N) out of the second to N-th circuit sections may be composed of an inductance element and a capacitance element connected in parallel.

In this case, the number of elements constituting the capacitance suppression element section that can reduce the parasitic capacitance up to an N-th order harmonic can be minimized.

When element values of the inductance element and the capacitance element of the first circuit section are respectively $L_o$ and $C_o$, and element values of the inductance element and the capacitance element of the i-th circuit section are respectively $L_{i-1}$ and $C_{i-1}$, the element values of the inductance element and the capacitance element of the first circuit section and an element value of a capacitance element of each of the second to N-th circuit sections may satisfy an expression (4), and $L_{i-1}$ may be $1/(C_{i-1}(\omega_{p(i-1)})^2)$.

[Expression 4]

$$\begin{bmatrix} \varpi_0 & \frac{-1}{\varpi_0} & \frac{\varpi_0}{-\varpi_0^2+\varpi_{p1}^2} & \cdots & \frac{\varpi_0}{-\varpi_0^2+\varpi_{pN-1}^2} \\ 2\varpi_0 & \frac{-1}{2\varpi_0} & \frac{2\varpi_0}{-2^2\varpi_0^2+\varpi_{p1}^2} & \cdots & \frac{2\varpi_0}{-2^2\varpi_0^2+\varpi_{pN-1}^2} \\ \vdots & \vdots & \vdots & \ddots & \vdots \\ N\varpi_0 & \frac{-1}{N\varpi_0} & \frac{N\varpi_0}{-N^2\varpi_0^2+\varpi_{p1}^2} & \cdots & \frac{N\varpi_0}{-N^2\varpi_0^2+\varpi_{pN-1}^2} \\ \varpi_M & \frac{-1}{\varpi_M} & \frac{\varpi_M}{-\varpi_M^2+\varpi_{p1}^2} & \cdots & \frac{\varpi_M}{-\varpi_M^2+\varpi_{pN-1}^2} \end{bmatrix} \begin{bmatrix} L_0 \\ \frac{1}{C_0} \\ \frac{1}{C_2} \\ \vdots \\ \frac{1}{C_{N-1}} \end{bmatrix} = \begin{bmatrix} \frac{1}{\varpi_0 C_X} \\ \frac{1}{2\varpi_0 C_X} \\ \vdots \\ \frac{1}{N\varpi_0 C_X} \\ \frac{\alpha R_{CO}}{-1+\alpha R_{CO}\varpi_M C_X} \end{bmatrix} \quad (4)$$

As mentioned above, the switching circuit which can increase the switching speed and can also improve the power efficiency without performing overdrive can be provided.

DETAILED DESCRIPTION

Figure 1:
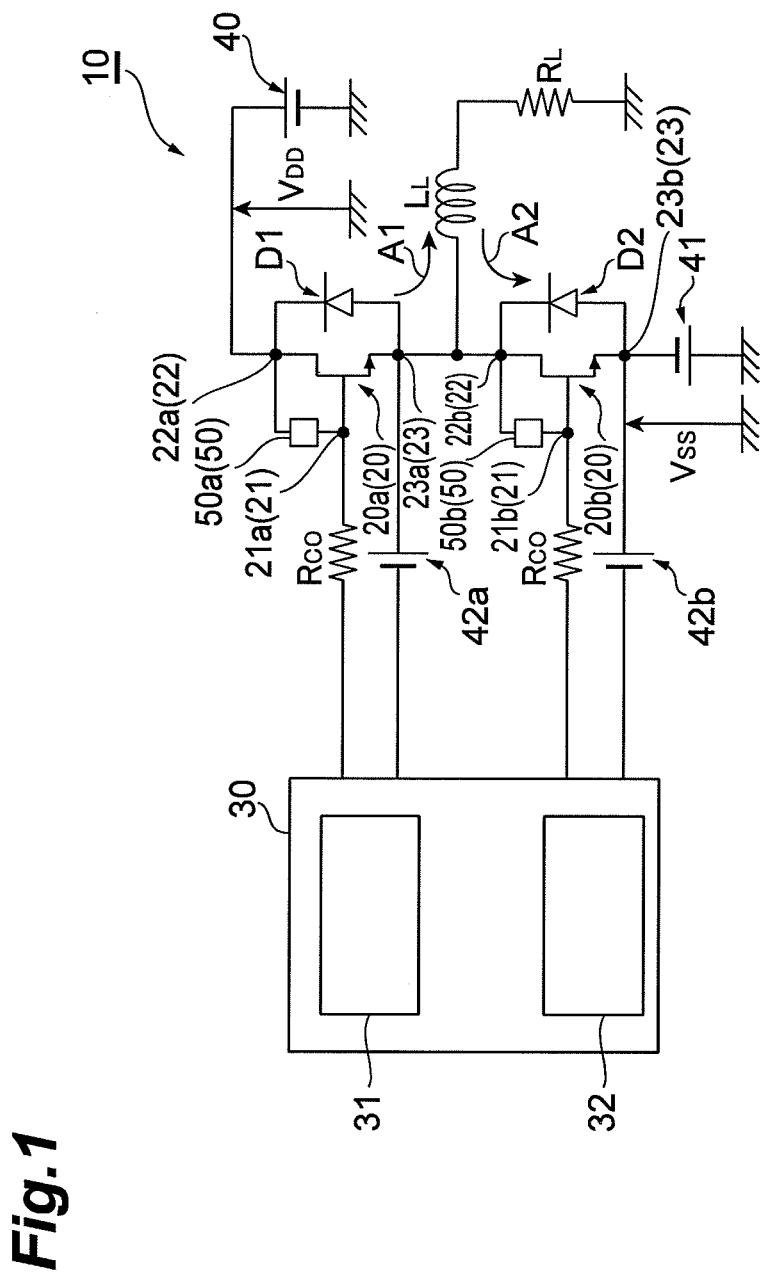
FIG. 1 is a circuit diagram illustrating the schematic configuration of a switching circuit according to a first embodiment.

In the following, embodiments of the present invention will be described by reference to the drawings. In the description of the drawings, the same elements are assigned the same reference numerals to omit the overlapping description. The dimensional ratios in the drawings do not necessarily correspond to those of the description.

First Embodiment

A switching circuit 10 according to a first embodiment of the present invention will be described based on FIG. 1. FIG. 1 is a circuit diagram illustrating the schematic configuration of the switching circuit 10 according to the first embodiment.

The switching circuit 10 includes a semiconductor switch element 20a and a semiconductor switch element 20b. The switching circuit 10 may include a drive circuit 30 that drives the respective semiconductor switch elements 20a and 20b.

Both the semiconductor switch elements 20a and 20b are MOS field-effect transistors (MOSFET). Examples of the MOSFET include a power MOSFET. In the present embodiment, the semiconductor switch elements 20a and 20b have the same configuration and device characteristic. Please note that the semiconductor switch elements 20a and 20b may have different configurations and device characteristics. The semiconductor switch element 20a has a gate terminal 21a as an input terminal, a drain terminal 22a as an output terminal, and a source terminal 23a as a common terminal. Similarly, the semiconductor switch element 20b has a gate terminal 21b as an input terminal, a drain terminal 22b as an output terminal, and a source terminal 23b as a common terminal.

The drain terminal 22a of the semiconductor switch element 20a is connected to a first power source 40. The first power source 40 supplies a positive voltage $V_{DD}$ to the drain terminal 22a. The positive voltage $V_{DD}$ is 400 V, for example. The source terminal 23a of the semiconductor switch element 20a is connected to the drain terminal 22b of the semiconductor switch element 20b. In this case, the semiconductor switch element 20a and the semiconductor switch element 20b are connected in series.

The source terminal 23b of the semiconductor switch element 20b is connected to a second power source 41. The second power source 41 supplies a negative voltage $V_{SS}$ to the source terminal 23b. The negative voltage $V_{SS}$ may be $-V_{DD}$.

A diode D1 connected between the drain terminal 22a and the source terminal 23a of the semiconductor switch element 20a, and a diode D2 connected between the drain terminal 22b and the source terminal 23b of the semiconductor switch element 20b represent parasitic diodes of the semiconductor switch elements 20a and 20b. In the present embodiment, the diodes D1 and D2 are described as the parasitic diodes since the semiconductor switch elements 20a and 20b are the MOS field-effect transistors. However, when the semiconductor switch elements 20a and 20b do not have the parasitic diodes, the diodes D1 and D2 may be connected to the semiconductor switch elements 20a and 20b as protective diodes. In this case, cathode terminals of the diodes D1 and D2 are respectively connected to the drain terminals 22a and 22b, and anode terminals of the diodes D1 and D2 are respectively connected to the source terminals 23a and 23b as shown in FIG. 1. Since the diodes D1 and D2 are described as the parasitic diodes of the semiconductor switch elements 20a and 20b in the present embodiment, the description thereof may be sometimes omitted.

The drive circuit 30 is a gate drive circuit that performs pulse width modulation (PWM) control of the respective semiconductor switch elements 20a and 20b. The drive circuit 30 is connected to the respective gate terminals (the input terminals) 21a and 21b of the semiconductor switch elements 20a and 20b. The drive circuit 30 supplies a PWM signal as a positive-phase pulse-like signal to the gate terminal 21a of the semiconductor switch element 20a, and also supplies a PWM signal as a negative-phase pulse-like signal to the gate terminal 21b of the semiconductor switch element 20b. The PWM signal has a modulation frequency $f_M$ and a clock frequency $f_{CLK}$ as a switching frequency for switching each of the semiconductor switch elements 20a and 20b. The PWM signal can be generated by comparing a signal wave (e.g., a sine wave) having the modulation frequency $f_M$ and a triangle wave having the clock frequency $f_{CLK}$ by a comparator or the like. In the drive circuit 30, a circuit section that supplies the PWM signal to the semiconductor switch element 20a is referred to as first drive circuit section 31, and a circuit section that supplies the PWM signal to the semiconductor switch element 20b is referred to as second drive circuit section 32. The first and second drive circuit sections 31 and 32 are respectively connected to negative poles of third power sources 42a and 42b. Positive poles of the third power sources 42a and 42b are respectively connected to the source terminals 23a and 23b of the semiconductor switch elements 20a and 20b. In the configuration, the third power sources 42a and 42b supply predetermined negative voltages (e.g., −11 V) based on the source terminals 23a and 23b to the first and second drive circuit sections 31 and 32.

As shown in FIG. 1, one end of an inductance element $L_L$ as an inductive load is connected to a connection point between the source terminal 23a of the semiconductor switch element 20a and the drain terminal 22b of the semiconductor switch element 20b. A resistance $R_L$ whose one end is grounded is connected to the other end of the inductance element $L_L$. An element value of the inductance element $L_L$ is 2.5 mH, for example. A resistance value of the resistance $R_L$ is 10Ω, for example.

In the above configuration, the pulse-like signal is supplied between the gate terminal 21a and the source terminal 23a from the first drive circuit section 31. The semiconductor switch element 20a is thereby controlled between an ON state in which a current flows between the drain terminal 22a and the source terminal 23a, and an OFF state in which no current flows between the drain terminal 22a and the source terminal 23a according to switching of the PWM signal as the pulse-like signal between a Hi level and a Low level. The same applies to the semiconductor switch element 20b. That is, when the PWM signal is supplied to the gate terminal 21b from the second drive circuit section 32, the semiconductor switch element 20b can be controlled between the ON state and the OFF state.

The PWM signal supplied to the semiconductor switch element 20a from the first drive circuit section 31 has a positive phase. Meanwhile, the PWM signal supplied to the semiconductor switch element 20b from the second drive circuit section 32 has a negative phase. Thus, when the semiconductor switch element 20a is in the ON state, the semiconductor switch element 20b is in the OFF state. When the semiconductor switch element 20a is in the ON state, a current flows from the drain terminal 22a to the source terminal 23a. Since the semiconductor switch element 20b is in the OFF state, the current flows toward a coil as the inductance element $L_L$.

Meanwhile, when the semiconductor switch element 20a is in the OFF state, the semiconductor switch element 20b is in the ON state. In this case, while the current from the semiconductor switch element 20a does not flow to the inductance element $L_L$, a current flows between the drain terminal 22b and the source terminal 23b of the semiconductor switch element 20b. As a result, the current flows from the inductance element $L_L$ to the semiconductor switch element 20b. Accordingly, according to the ON/OFF switching of the semiconductor switch element 20a (or the semiconductor switch element 20b), the direction of the current flowing through the inductance $L_L$ is switched as indicated by arrows A1 and A2 in FIG. 1.

In the switching circuit 10, capacitance suppression element sections 50a and 50b are connected to the semiconductor switch elements 20a and 20b so as to increase the switching speed of each of the semiconductor switch elements 20a and 20b and improve the power efficiency of the switching circuit 10. The capacitance suppression element sections 50a and 50b are element sections that suppress the influence of parasitic capacitance existing in each of the semiconductor switch elements 20a and 20b.

In the following, the capacitance suppression element sections 50a and 50b will be described. Since the semiconductor switch elements 20a and 20b have the same configuration as described above in the present embodiment, the semiconductor switch elements 20a and 20b are referred to as semiconductor switch element 20 except when the semiconductor switch elements 20a and 20b are separately described. The same applies to the description of each terminal of the semiconductor switch elements 20a and 20b. Since the semiconductor switch elements 20a and 20b have the same configuration, the capacitance suppression element sections 50a and 50b may also have the same configuration. Thus, the capacitance suppression element sections 50a and 50b are referred to as capacitance suppression element section 50 except when the capacitance suppression element sections 50a and 50b are separately described.

Figure 2:
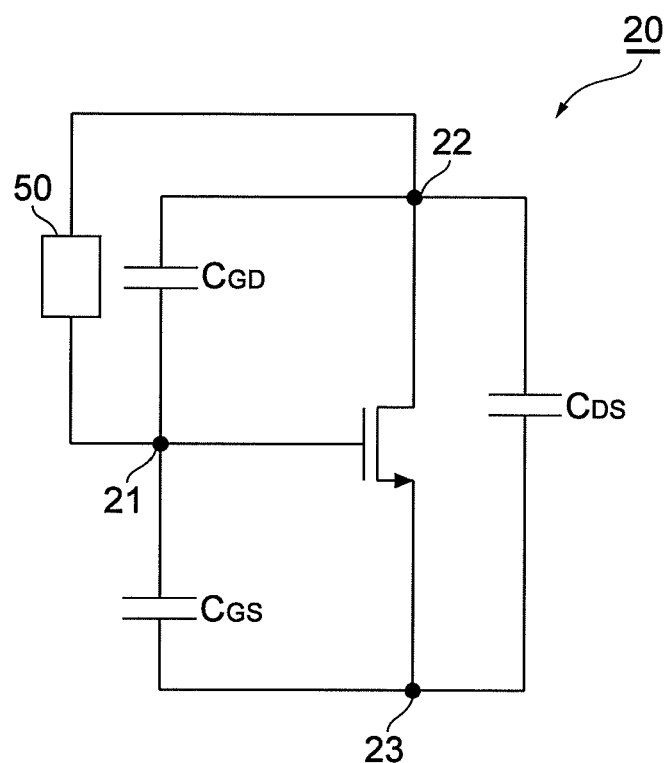
FIG. 2 is a diagram illustrating one example of the arrangement relationship between a parasitic capacitance of a semiconductor switch element and a capacitance suppression element section used in FIG. 1.

FIG. 2 is a diagram for explaining the relationship between the parasitic capacitance existing in the semiconductor switch element and the capacitance suppression element section. As shown in FIG. 2, parasitic capacitances $C_{GS}$, $C_{GD}$, and $C_{DS}$ exist between the respective terminals of the semiconductor switch element 20. In FIG. 2, the parasitic capacitances $C_{GS}$, $C_{GD}$, and $C_{DS}$ are shown as capacitance elements.

At least one capacitance suppression element section 50 is connected to the semiconductor switch element 20 so as to suppress at least one of the parasitic capacitances $C_{GS}$, $C_{GD}$, and $C_{DS}$. The capacitance suppression element section 50 is connected between the terminals where the parasitic capacitance $C_{GS}$, $C_{GD}$, or $C_{DS}$ to be suppressed exists. In this case, the capacitance suppression element section 50 is connected in parallel with the parasitic capacitance $C_{GS}$, $C_{GD}$, or $C_{DS}$ to be suppressed. FIG. 2 shows one example in which the capacitance suppression element section 50 is connected between the gate terminal 21 and the drain terminal 22 to suppress the parasitic capacitance $C_{GD}$. The parasitic capacitance to be suppressed by the capacitance suppression element section 50 out of the parasitic capacitances $C_{GS}$, $C_{GD}$, and $C_{DS}$ is referred to as parasitic capacitance $C_X$.

The capacitance suppression element section 50 suppresses the parasitic capacitance $C_X$ of the semiconductor switch element 20 at a frequency N times as high as the clock frequency of the PWM signal. The capacitance suppression element section 50 is configured to satisfy following conditions.

Condition (i): An impedance of the parasitic capacitance $C_X$ and an impedance of the capacitance suppression element section 50 are equal in magnitude to each other, and have opposite signs from each other at an angular frequency of an N-th order harmonic of the clock frequency of the PWM signal.

Condition (ii): An output impedance $R_{CO}$ of the drive circuit 30 connected to the gate terminal 21 of the semiconductor switch element 20 is sufficiently smaller than an input impedance of the semiconductor switch element 20. In the circuit configuration shown in FIG. 1, the output impedance $R_{CO}$ with respect to the semiconductor switch element 20a is an output impedance of the first drive circuit section 31, and corresponds to a resistance value of a resistance $R_{CO}$ shown between the first drive circuit section 31 and the source terminal 23a. Similarly, in the circuit configuration shown in FIG. 1, the output impedance $R_{CO}$ with respect to the semiconductor switch element 20b is an output impedance of the second drive circuit section 32, and corresponds to a resistance value of a resistance $R_{CO}$ shown between the second drive circuit section 32 and the source terminal 23b.

When a reactance of the capacitance suppression element section 50 is $X(\omega)$ as a function of an angular frequency ω, the above (i) is expressed by an expression (5), and the above (ii) is expressed by an expression (6). That is, the capacitance suppression element section 50 is configured to satisfy the expressions (5) and (6). In the following description, $X(\omega)$ is also referred to as reactance curve of the capacitance suppression element section 50.

[Expression 5]

$$jX(n\varpi_0) = -\frac{1}{jn\varpi_0 C_X} \quad (n = 1, 2, \ldots, N) \quad (5)$$

[Expression 6]

$$\left|\frac{1}{j\varpi_M C_X + \frac{1}{jX(\varpi_M)}}\right| = \alpha R_{CO} (\alpha \gg 1) \quad (6)$$

In the expressions (5) and (6), j represents an imaginary unit, $\omega_0$ represents a product of the clock frequency $f_{CLK}$ of the PWM signal and $2\pi$, $\omega_M$ represents a product of the modulation frequency $f_M$ of the PWM signal and $2\pi$, and $C_X$ represents the parasitic capacitance between the terminals of the semiconductor switch element 20 where the capacitance suppression element section 50 is connected. For example, when the capacitance suppression element section 50 is connected between the gate terminal 21 and the drain terminal 22, $C_X = C_{GD}$. As described above, $R_{CO}$ represents the output impedance of the drive circuit 30 connected to the gate terminal 21 of the semiconductor switch element 20. In the expression (6), $\alpha$ may be sufficiently greater than 1. For example, $\alpha$ may be 10 or more, or may be 100 or more.

When the capacitance suppression element section 50 is connected between the terminals where the parasitic capacitance $C_X$ to be cancelled exists out of the parasitic capacitances $C_{GS}$, $C_{GD}$, and $C_{DS}$ between the terminals of the semiconductor switch element 20, the capacitance suppression element section 50 is connected in parallel with the parasitic capacitance $C_X$. When the capacitance suppression element section 50 satisfies the expressions (5) and (6), a combined impedance of the capacitance suppression element section 50 and the parasitic capacitance $C_X$ in parallel therewith has a very high value (e.g., an infinity ∞) at the N-th order harmonic of the clock frequency $f_{CLK}$ of the PWM signal. Thus, the semiconductor switch element 20 to which the capacitance suppression element section 50 satisfying the expression (5) is connected can operate as in a case in which the parasitic capacitance $C_X$ between the terminals where the capacitance suppression element section 50 is connected practically does not exist. That is, the capacitance suppression element section 50 can reduce the parasitic capacitance $C_X$ of the semiconductor switch element 20 in the operation of the semiconductor switch element 20.

Next, the circuit configuration of the capacitance suppression element section 50 will be specifically described.

Figure 3:
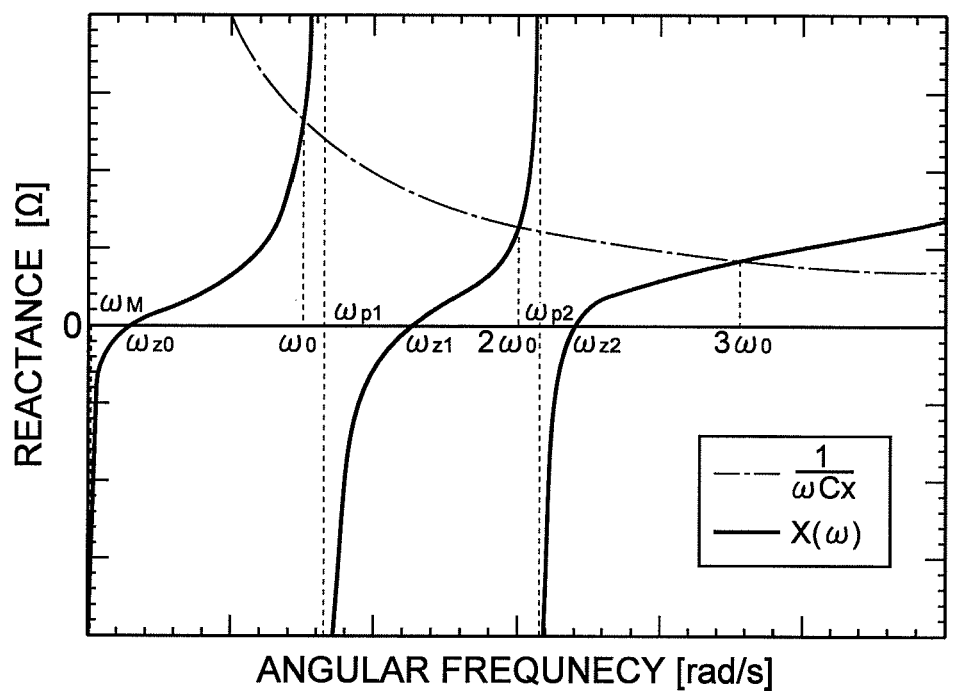
FIG. 3 is a graph showing the relationship between a reactance curve of the capacitance suppression element section and a reactance curve of the parasitic capacitance.

FIG. 3 is a graph showing the relationship between a reactance curve of the capacitance suppression element section and a reactance curve of the parasitic capacitance, and corresponds to the relationship of the expression (5). FIG. 3 shows a case of N=3 as one example. In FIG. 3, a horizontal axis represents an angular frequency ω, and a vertical axis represents a reactance [Ω]. A solid line in FIG. 3 represents the reactance curve X(ω) of the capacitance suppression element section 50. An dashed dotted line in FIG. 3 represents the reactance curve $(1/\omega C_X)$ of the parasitic capacitance. In FIG. 3, the reactance curve of the parasitic capacitance $C_X$ is a curve representing an absolute value of a reactance of the parasitic capacitance $C_X$, $\omega_{pn}$ represents an angular frequency of an n-th pole from a direct current (i.e., ω=0), and $\omega_{z(n-1)}$ represents an angular frequency that satisfies X(ω)=0 as an n-th angular frequency from the direct current.

Referring to FIG. 3, the reactance function X(ω) of the capacitance suppression element section 50 having the minimum number of elements constituting the capacitance suppression element section 50 can satisfy an expression (7).

[Expression 7]

$$jX(\varpi) = \frac{\beta(-\varpi^2 + \varpi_{z0}^2)(-\varpi^2 + \varpi_{z1}^2) \ldots (-\varpi^2 + \varpi_{zN-1}^2)}{j\varpi^2(-\varpi^2 + \varpi_{p1}^2) \ldots (-\varpi^2 + \varpi_{pN-1}^2)} \quad (7)$$

In the expression (7), when t is an integer of 1 to N−1, $\omega_{pt}$, $\omega_{z0}$, and $\omega_{zt}$ are values determined so as to satisfy $0 < \omega_{z0} < \omega_0$, and $t\omega_0 < \omega_{pt} < \omega_{zt} < (t+1)\omega_0$, and also satisfy the expressions (5) and (6), and β is any value determined so as to satisfy the expressions (5) and (6).

Figure 4:
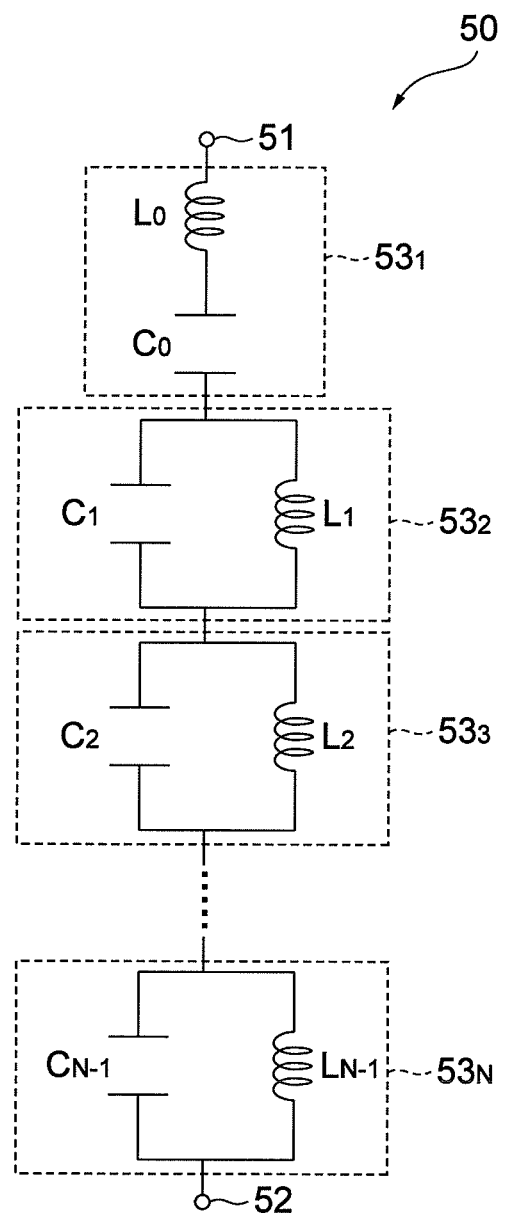
FIG. 4 is a diagram illustrating one example of the circuit configuration of the capacitance suppression element section.

FIG. 4 is a diagram illustrating one example of the circuit configuration of the capacitance suppression element section 50 that satisfies the expression (7). The capacitance suppression element section 50 has N circuit sections of first to N-th circuit sections $53_1$ to $53_N$ connected in series between terminals 51 and 52 of the capacitance suppression element section 50. The first circuit section $53_1$ is obtained by connecting a capacitance element $C_0$ and an inductance element $L_0$ in series. In this case, the first circuit section $53_1$ is a series circuit. In a case of N=1, the capacitance suppression element section 50 may be composed only of the first circuit section $53_1$. When N is 2 or more, an i-th circuit section $53_i$ (i is an integer of 2 to N) out of the second to N-th circuit sections $53_2$ to $53_N$ is obtained by connecting a capacitance element $C_{i-1}$ and an inductance element $L_{i-1}$ in parallel. As shown in FIG. 4, the i-th circuit section $53_i$ constitutes a parallel resonant circuit. In the following, the circuit configuration shown in FIG. 4 is also referred to as basic configuration for the purpose of description. In the basic configuration, the parasitic capacitance can be reduced with respect to another harmonic by increasing the parallel resonant circuit by one stage as shown in FIG. 4. As is also understood from the circuit configuration, when the parasitic capacitance can be reduced with respect to the N-th order harmonic, the parasitic capacitance can be also reduced with respect to any harmonic other than the N-th order harmonic by increasing the number of stages of the parallel resonant circuit. It is not necessary to reduce the parasitic capacitance sequentially from a lowest order harmonic. It is also not necessary to reduce the parasitic capacitance only with respect to a next-order harmonic. For example, the parasitic capacitance may be reduced with respect to harmonics of every two orders such as odd orders of 1, 3, 5, 7 and so on.

One example of a method for deriving element values of the capacitance elements $C_0$ and $C_{i-1}$, and the inductance elements $L_0$ and $L_{i-1}$ in the basic configuration will be described.

The expression (5) is expressed as expressions $(8_0)$ to $(8_{N-1})$.

[Expression 8]

$$jX(\varpi_0) = -\frac{1}{j\varpi_0 C_X} \quad (8_0)$$

$$jX(2\varpi_0) = -\frac{1}{j2\varpi_0 C_X} \quad (8_1)$$

-continued $$jX(3\varpi_0) = -\frac{1}{j3\varpi_0 C_X} \quad (8_2)$$

$$\vdots$$

$$jX(N\varpi_0) = -\frac{1}{jN\varpi_0 C_X} \quad (8_{N-1})$$

In the basic configuration, the expression (7) can be transformed into an expression (9).

[Expression 9]

$$jX(\varpi) = j\varpi L_0 + \frac{1}{j\varpi C_0} + \frac{1}{C_1}\frac{j\varpi_0}{-\varpi_0^2 + \varpi_{p1}^2} + \frac{1}{C_2}\frac{j\varpi_0}{-\varpi_0^2 + \varpi_{p2}^2} + \ldots + \frac{1}{C_{N-1}}\frac{j\varpi_0}{-\varpi_0^2 + \varpi_{pN-1}^2} \quad (9)$$

Please note that $L_1=1/(C_1(\omega_{p1})^2)$, $L_2=1/(C_2(\omega_{p2})^2)$, ..., and $L_{N-1}=1/(C_{N-1}(\omega_{p(N-1)})^2)$.

An expression (10) is obtained by substituting the expression (9) into the expressions $(8_0)$ to $(8_{N-1})$ and the expression (6), and thereafter performing a matrix calculation.

[Expression 10]

$$\begin{bmatrix} \varpi_0 & \frac{-1}{\varpi_0} & \frac{\varpi_0}{-\varpi_0^2 + \varpi_{p1}^2} & \cdots & \frac{\varpi_0}{-\varpi_0^2 + \varpi_{pN-1}^2} \\ 2\varpi_0 & \frac{-1}{2\varpi_0} & \frac{2\varpi_0}{-2^2\varpi_0^2 + \varpi_{p1}^2} & \cdots & \frac{2\varpi_0}{-2^2\varpi_0^2 + \varpi_{pN-1}^2} \\ \vdots & \vdots & \vdots & \ddots & \vdots \\ N\varpi_0 & \frac{-1}{N\varpi_0} & \frac{N\varpi_0}{-N^2\varpi_0^2 + \varpi_{p1}^2} & \cdots & \frac{N\varpi_0}{-N^2\varpi_0^2 + \varpi_{pN-1}^2} \\ \varpi_M & \frac{-1}{\varpi_M} & \frac{\varpi_M}{-\varpi_M^2 + \varpi_{p1}^2} & \cdots & \frac{\varpi_M}{-\varpi_M^2 + \varpi_{pN-1}^2} \end{bmatrix} \begin{bmatrix} L_0 \\ \frac{1}{C_0} \\ \frac{1}{C_2} \\ \vdots \\ \frac{1}{C_{N-1}} \end{bmatrix} = \begin{bmatrix} \frac{1}{\varpi_0 C_X} \\ \frac{1}{2\varpi_0 C_X} \\ \vdots \\ \frac{1}{N\varpi_0 C_X} \\ \frac{\alpha R_{CO}}{-1 + \alpha R_{CO}\varpi_M C_X} \end{bmatrix} \quad (10)$$

In the expression (10), $\omega_{p1}$ to $\omega_{p(N-1)}$ is given within a range of $0<\omega_{z0}<\omega_0$, and $t\omega_0<\omega_{pt}<\omega_{zt}<(t+1)\omega_0$ (t is an integer of 1 to N-1). The respective element values can be thereby obtained from the expression (10).

In the following, the case of N=3 will be specifically described. In this case, the expressions (9) and (10) correspond to next expressions (11) and (12).

[Expression 11]

$$jX(\varpi) = j\varpi L_0 + \frac{1}{j\varpi C_0} + \frac{1}{C_1}\frac{j\varpi_0}{-\varpi_0^2 + \varpi_{p1}^2} + \frac{1}{C_2}\frac{j\varpi_0}{-\varpi_0^2 + \varpi_{p2}^2} \quad (11)$$

[Expression 12]

$$\begin{bmatrix} \varpi_0 & \frac{-1}{\varpi_0} & \frac{\varpi_0}{-\varpi_0^2 + \varpi_{p1}^2} & \frac{\varpi_0}{-\varpi_0^2 + \varpi_{p2}^2} \\ 2\varpi_0 & \frac{-1}{2\varpi_0} & \frac{2\varpi_0}{-4\varpi_0^2 + \varpi_{p1}^2} & \frac{2\varpi_0}{-4\varpi_0^2 + \varpi_{p2}^2} \\ 3\varpi_0 & \frac{-1}{3\varpi_0} & \frac{3\varpi_0}{-9\varpi_0^2 + \varpi_{p1}^2} & \frac{3\varpi}{-9\varpi_0^2 + \varpi_{p2}^2} \\ \varpi_M & \frac{-1}{\varpi_M} & \frac{\varpi_M}{-\varpi_M^2 + \varpi_{p1}^2} & \frac{\varpi_M}{-\varpi_0^2 + \varpi_{p2}^2} \end{bmatrix} \begin{bmatrix} L_0 \\ \frac{1}{C_0} \\ \frac{1}{C_1} \\ \frac{1}{C_2} \end{bmatrix} = \begin{bmatrix} \frac{1}{\varpi_0 C_X} \\ \frac{1}{2\varpi_0 C_X} \\ \frac{1}{3\varpi_0 C_X} \\ \frac{\alpha R_{CO}}{-1 + \alpha R_{CO}\varpi_M C_X} \end{bmatrix} \quad (12)$$

Here, when $\omega_M=120\pi$ [rad/s] by setting the modulation frequency $f_M$ of the PWM signal to 60 Hz, $\omega_0=240000\pi$ [rad/s], $R_{CO}=30[\Omega]$, $\alpha=100$, C=1.9 [nF], $\omega_{p1}=264000$ [rad/s], and $\omega_{p2}=504000$ [rad/s], $L_0$, $C_0$, $L_1$, $C_1$, $L_2$, and $C_2$ are as follows.

$L_0=136.9$ [pH]

$C_0=882.3$ [nF]

$L_1=133.4$ [pH]

$C_1=10.9$ [nF]

$L_2=9.4$ [μH]

$C_2=28.2$ [nF]

By using $L_0$, $C_0$, $L_1$, $C_1$, $L_2$, and $C_2$ obtained by the calculation, $\beta$, $\omega_{z0}$, and $\omega_{z1}$ can be also obtained. One example of a method for obtaining $\beta$, $\omega_{z0}$, and $\omega_{z1}$ will be described.

In the case of N=3, the right-hand side of the expression (7) can be transformed as described below.

[Expression 13]

$$\frac{\beta(-\varpi^2 + \varpi_{z0}^2)(-\varpi^2 + \varpi_{z1}^2)(-\varpi^2 + \varpi_{z2}^2)}{j\varpi(-\varpi^2 + \varpi_{p1}^2)(-\varpi^2 + \varpi_{p2}^2)} = \quad (13)$$

$$\frac{\beta((j\varpi)^2 + \varpi_{z0}^2)((j\varpi)^2 + \varpi_{z1}^2)((j\varpi)^2 + \varpi_{z2}^2)}{j\varpi((j\varpi)^2 + \varpi_{p1}^2)((j\varpi)^2 + \varpi_{p2}^2)} =$$

$$\frac{\beta\{(j\varpi)^6 + (j\varpi)^4(\varpi_{z0}^2 + \varpi_{z1}^2 + \varpi_{z2}^2)\}}{j\varpi((j\varpi)^4 + (j\varpi)^2(\varpi_{p1}^2 + \varpi_{p2}^2) + \varpi_{p1}^2\varpi_{p2}^2)} +$$

$$\frac{\beta\{(j\varpi)^2(\varpi_{z0}^2\varpi_{z1}^2 + \varpi_{z0}^2\varpi_{z2}^2 + \varpi_{z1}^2\varpi_{z2}^2)\}}{j\varpi((j\varpi)^4 + (j\varpi)^2(\varpi_{p1}^2 + \varpi_{p2}^2) + \varpi_{p1}^2\varpi_{p2}^2)}$$

Moreover, in the case of N=3, a next expression is obtained from the right-hand side of the expression (13).

[Expression 14]

$$j\varpi L_0 + \frac{1}{j\varpi_0} + \frac{1}{C_1}\frac{j\varpi_0}{-\varpi_0^2 + \varpi_{p1}^2} + \frac{1}{C_2}\frac{j\varpi_0}{-\varpi_0^2 + \varpi_{p2}^2} = \qquad (14)$$

$$\frac{L_0\left\{(j\varpi)^6 + (j\varpi)^4\frac{1}{L_0}\left(L_0(\varpi_{p1}^2 + \varpi_{p2}^2) + \frac{1}{C_0} + \frac{1}{C_1} + \frac{1}{C_2}\right)\right\}}{j\varpi((j\varpi)^4 + (j\varpi)^2 + (\varpi_{p1}^2 + \varpi_{p2}^2) + \varpi_{p1}^2\varpi_{p2}^2)} +$$

$$\frac{L_0\left\{(j\varpi)^2\left(L_0 + \frac{\varpi_{p1}^2 + \varpi_{p2}^2}{C_0} + \frac{\varpi_{p2}^2}{C_1} + \frac{\varpi_{p1}^2}{C_2}\right) + \frac{\varpi_{p1}^2\varpi_{p2}^2}{L_0 C_0}\right\}}{j\varpi((j\varpi)^4 + (j\varpi)^2(\varpi_{p1}^2 + \varpi_{p2}^2) + \varpi_{p1}^2\varpi_{p2}^2)}$$

A relationship described below is obtained by comparing the expressions (13) and (14).

[Expression 15]

$$\beta = L_0 \qquad (15a)$$

$$\varpi_{z0}^2 + \varpi_{z1}^2 + \varpi_{z2}^2 = \frac{1}{L_0}\left(L_0(\varpi_{p1}^2 + \varpi_{p2}^2) + \frac{1}{C_0} + \frac{1}{C_1} + \frac{1}{C_2}\right) \qquad (15b)$$

$$\varpi_{z0}^2\varpi_{z1}^2 + \varpi_{z0}^2\varpi_{z2}^2 + \varpi_{z1}^2\varpi_{z2}^2 = L_0 + \frac{\varpi_{p1}^2 + \varpi_{p2}^2}{C_0} + \frac{\varpi_{p2}^2}{C_1} + \frac{\varpi_{p1}^2}{C_2} \qquad (15c)$$

$$\varpi_{z0}^2\varpi_{z1}^2\varpi_{z2}^2 = \frac{\varpi_{p1}^2\varpi_{p2}^2}{L_0 C_0} \qquad (15d)$$

$\beta$, $\omega_{z0}$, $\omega_{z1}$, and $\omega_{z2}$ can be obtained based on the expressions (15a) to (15d) and the calculated $L_0$, $C_0$, $L_1$, $C_1$, $L_2$, and $C_2$.

In the configuration in which the capacitance suppression element section 50 has the first to N-th circuit sections 53$_1$ to 53$_N$ as shown in FIG. 4, the element values of the respective elements of the capacitance suppression element section 50 can be determined as described above, and $\beta$, $\omega_{z0}$, $\omega_{z1}$, $\omega_{z2}$, ..., and $\omega_{z(N-1)}$ can be also obtained as described in the case of N=3.

Figure 5:
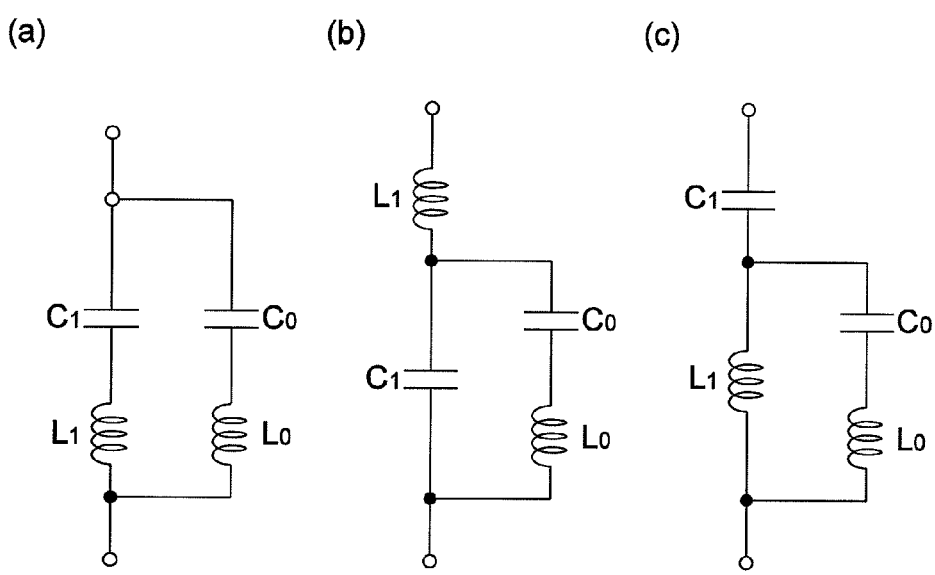
FIG. 5 are diagrams illustrating examples of the circuit configuration of the capacitance suppression element section that can reduce the influence of the parasitic capacitance up to a second-order harmonic of a clock frequency.
Figure 6:
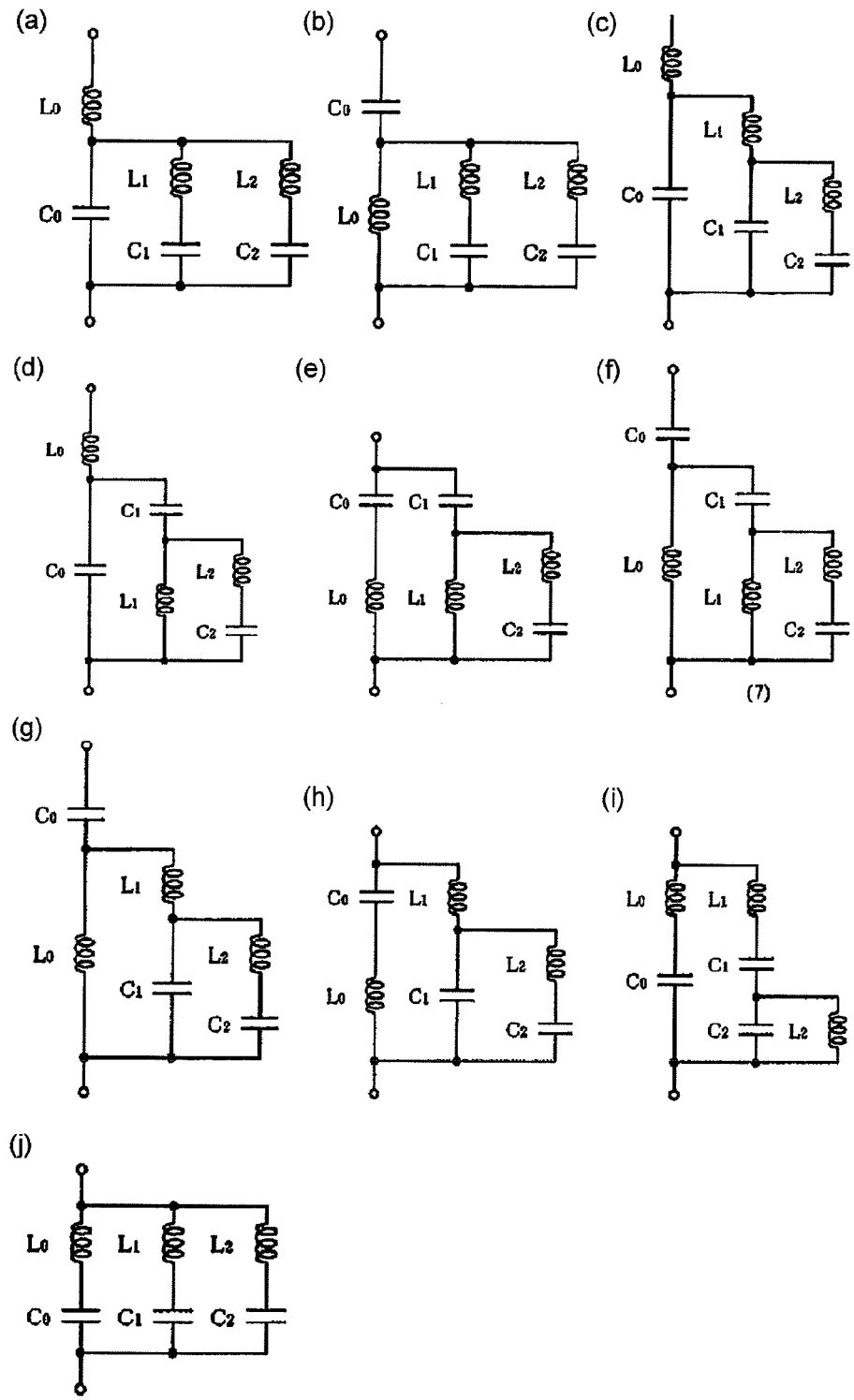
FIG. 6 are diagrams illustrating examples of the circuit configuration of the capacitance suppression element section that can reduce the influence of the parasitic capacitance up to a third-order harmonic of the clock frequency.
Figure 7:
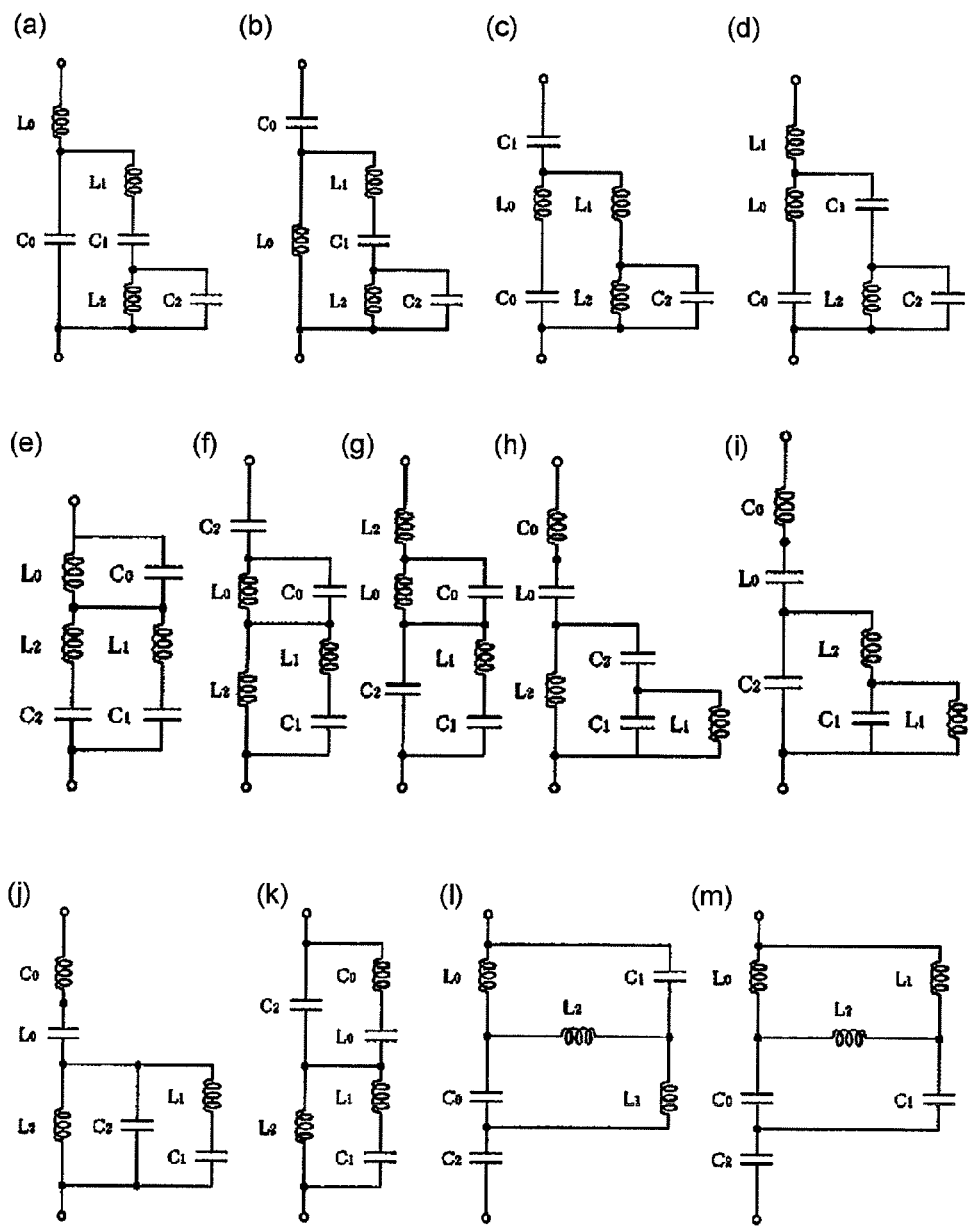
FIG. 7 are diagrams illustrating other examples of the circuit configuration of the capacitance suppression element section that can reduce the influence of the parasitic capacitance up to the third-order harmonic of the clock frequency.
Figure 8:
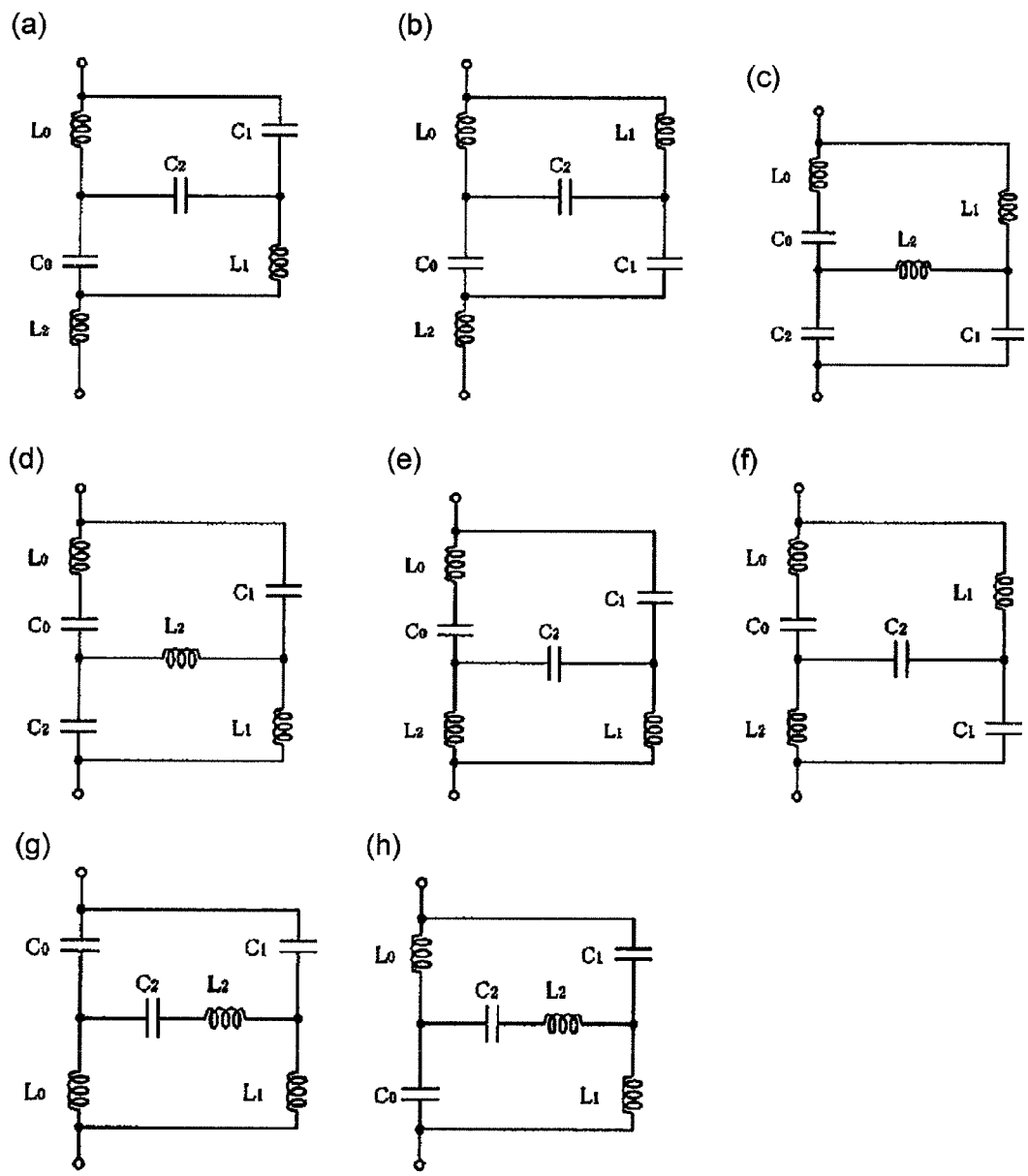
FIG. 8 are diagrams illustrating still other examples of the circuit configuration of the capacitance suppression element section that can reduce the influence of the parasitic capacitance up to the third-order harmonic of the clock frequency.

Here, one example of the element configuration of the capacitance suppression element section 50 has been described by reference to FIG. 4. However, the configuration of the capacitance suppression element section 50 is not limited to that in FIG. 4. For example, in a case of N=2, element configurations shown in FIGS. 5(*a*) to 5(*c*) may be employed. In the case of N=3, element configurations shown in FIGS. 6(*a*) to 6(*j*), FIGS. 7(*a*) to 7(*m*), and FIGS. 8(*a*) to 8(*h*) may be further employed. FIGS. 6(*a*) to 6(J), FIGS. 7(*a*) to 7(*m*), and FIGS. 8(*a*) to 8(*h*) respectively show examples of the element configuration of the case where N=3 and the number of elements is minimum. In the drawings, $C_0$, $C_1$, $C_2$, $L_0$, $L_1$, and $L_2$ are assigned to capacitance elements and inductance elements in a similar manner to the case in FIG. 4. Element values of the elements are determined so as to satisfy the expressions (5) and (6). In the case of N=3 in FIG. 4, and in the case of N=3 as shown in the examples in FIGS. 6(*a*) to 6(*j*), FIGS. 7(*a*) to 7(*m*), and FIGS. 8(*a*) to 8(*h*), the capacitance suppression element section 50 includes six reactance elements. FIG. 4 (N=3), FIGS. 6(*a*) to 6(*j*), FIGS. 7(*a*) to 7(*m*), and FIGS. 8(*a*) to 8(*h*) show the examples of the circuit configuration in the case where the capacitance suppression element section 50 has the minimum number of elements. Thus, in the case of N=3, the capacitance suppression element section 50 includes at least six reactance elements.

Next, one example of a method for calculating the element values in the case of the circuit configuration shown in FIG. 6(*a*) will be described.

The right-hand side of the expression (14) is represented as an expression (16) by substituting s=j$\omega$ in the right-hand side of the expression (14).

[Expression 16]

$$X(s) = \frac{a_3 s^6 + a_3 s^4 + a_1 s^2 + a_0}{s(b_2 s^4 + b_1 s^2 + b_0)} \qquad (16)$$

Please note that $a_3$, $a_2$, $a_1$, $a_0$, $b_2$, $b_1$, and $b_0$ in the expression (16) are as follows, and are values determined by the values calculated in the case of N=3 in the basic configuration in FIG. 4.

[Expression 17]

$$a_3 = L_0, \qquad (17a)$$

$$a_2 = L_0 + (\varpi_{p1}^2 + \varpi_{p2}^2) + \frac{1}{C_0} + \frac{1}{C_1} + \frac{1}{C_2} \qquad (17b)$$

$$a_1 = L_0 + \frac{\varpi_{p1}^2 + \varpi_{p2}^2}{C_0} + \frac{\varpi_{p2}^2}{C_1} + \frac{\varpi_{p1}^2}{C_2}, \qquad (17c)$$

$$a_0 = \frac{\varpi_{p1}^2 \varpi_{p2}^2}{L_0 C_0} \qquad (17d)$$

$$b_2 = 1, \qquad (17e)$$

$$b_1 = \varpi_{p1}^2 + \varpi_{p2}^2, \qquad (17f)$$

$$b_0 = \varpi_{p1}^2 \varpi_{p2}^2 \qquad (17g)$$

The expression (16) corresponds to the expression (7) in the case of N=3, and represents the reactance of the capacitance suppression element section 50. Thus, the expression (16) may also include the circuit configuration in FIG. 6(*a*). Meanwhile, an expression corresponding to the element configuration in FIG. 6(*a*) is as in an expression (18). As described above, $C_0$, $C_1$, $C_2$, $L_0$, $L_1$, and $L_2$ are assigned to the capacitance elements and the inductance elements in FIG. 6(*a*) in a similar manner to the case in FIG. 4. In a following calculation in an expression (18), $C_0$, $C_1$, $C_2$, $L_0$, $L_1$, and $L_2$ are represented as $C_{0a}$, $C_{1a}$, $C_{2a}$, $L_{0a}$, $L_{1a}$, and $L_{2a}$ so as to be distinguished from the case in FIG. 4.

[Expression 18]

$$X(s) = sL_{0a} + \cfrac{1}{sC_{0a} + \cfrac{1}{sL_{1a} + \cfrac{1}{sC_{1a}}} + \cfrac{1}{sL_{2a} + \cfrac{1}{sC_{2a}}}} \qquad (18)$$

The right-hand side of the expression (16) is transformed into the right-hand side of the expression (18) so as to obtain the respective element values.

[Expression 19]

$$\frac{a_3 s^6 + a_3 s^4 + a_1 s^2 + a_0}{s(b_2 s^4 + b_1 s^2 + b_0)} = \quad (19)$$

$$s\frac{a_3}{b_2} + \frac{a_{2-1} s^4 + a_{1-1} s^2 + a_{0-1}}{s(b_2 s^4 + b_1 s^2 + b_0)} = sL_{0a} + \frac{1}{\frac{s(b_2 s^4 + b_1 s^2 + b_0)}{a_{2-1} s^4 + a_{1-1} s^2 + a_{0-1}}} =$$

$$sL_{0a} + \frac{1}{s\frac{b_2}{a_{2-1}} + \frac{b_{1-1} s^2 + b_{0-1}}{a_{2-1} s^4 + a_{1-1} s^2 + a_{0-1}}} =$$

$$sL_{0a} + \frac{1}{sC_{0a} + \frac{b_{1-2} s^2 + b_{0-2}}{(s^2 + X)(s^2 + Y)}} =$$

$$sL_{0a} + \cfrac{1}{sC_{0a} + \cfrac{1}{s\cfrac{1}{W} + \cfrac{X}{sW}} + \cfrac{1}{s\cfrac{1}{V} + \cfrac{Y}{sV}}}$$

$$sL_{0a} + \cfrac{1}{sC_{0a} + \cfrac{1}{sL_{1a} + \cfrac{1}{sC_{1a}}} + \cfrac{1}{sL_{2a} + \cfrac{1}{sC_{2a}}}}$$

By comparing rational function coefficients before and after each transformation of the right-hand side of the expression (16), expressions (20a) to (20f), expressions (21a) to (21g), and expressions (22a) to (22d) can be obtained. From the expressions, the element values of the respective elements in the case of the circuit configuration shown in FIG. 6(a), that is, $L_{0a}$, $C_{0a}$, $L_{1a}$, $C_{1a}$, $L_{2a}$, and $C_{2a}$ can be obtained.

[Expression 20]

$$L_{0a} = \frac{a_3}{b_2} \quad (20a)$$

$$C_{0a} = \frac{b_2}{a_{2-1}}, \quad (20b)$$

$$L_{1a} = \frac{X - Y}{b_{0-2} - b_{1-2} X}, \quad (20c)$$

$$C_{1a} = \frac{b_{0-2} - b_{1-2} X}{X(X - Y)} \quad (20d)$$

$$L_{2a} = \frac{X - Y}{b_{1-2} Y - b_{0-2}}, \quad (20e)$$

$$C_{2a} = \frac{b_{1-2} Y - b_{0-2}}{Y(X - Y)} \quad (20f)$$

[Expression 21]

$$a_{2-1} = a_2 - \frac{b_1}{b_2} a_3, \quad (21a)$$

$$a_{1-1} = a_1 - \frac{b_0}{b_2} a_3, \quad (21b)$$

$$a_{0-1} = a_0 \quad (21c)$$

$$b_{1-1} = b_1 - \frac{a_{1-1}}{a_{2-1}} b_2, \quad (21d)$$

$$b_{0-1} = b_0 - \frac{a_{0-1}}{a_{2-1}} b_2, \quad (21e)$$

$$b_{2-1} = \frac{b_{1-1}}{a_{2-1}}, \quad (21f)$$

$$b_{0-2} = \frac{b_{0-1}}{a_{2-1}} \quad (21g)$$

[Expression 22]

$$X = \frac{a_{1-1} - \sqrt{a_{1-1}^2 - 4 a_{2-1} a_{0-1}}}{2 a_{2-1}}, \quad (22a)$$

$$Y = \frac{a_{1-1} + \sqrt{a_{1-1}^2 - 4 a_{2-1} a_{0-1}}}{2 a_{2-1}} \quad (22b)$$

$$W = \frac{b_{0-2} - b_{1-2} X}{X - Y}, \quad (22c)$$

$$V = \frac{b_{1-2} Y - b_{0-2}}{X - Y} \quad (22d)$$

In the expressions (20a) to (20f), $a_3$, $a_2$, $a_1$, $a_0$, $b_2$, $b_1$, and $b_0$ are obtained by the expressions (17a) to (17g). As described above, the expressions (17a) to (17g) are based on the values calculated in the case of N=3 in the basic configuration in FIG. 4.

The element values of the elements of other circuit configurations such as the respective circuit configurations shown in FIGS. 5(a) to 5(c) may be similarly obtained. That is, the expression (11) is transformed so as to represent the characteristics of the respective circuit configurations. The element values of the respective circuit configurations can be obtained by using $a_3$, $a_2$, $a_1$, $a_0$, $b_2$, $b_1$, and $b_0$ obtained by comparison of rational function coefficients before and after the expression transformation. However, if the element values cannot be determined by the expression transformation or the like described above even when the circuit configuration is determined, the element values may be also determined by using a numerical analytical method.

In the above description, the respective element values of the capacitance suppression element section 50 are determined by assuming the circuit configuration as shown in FIG. 4 or the like. The circuit configuration of the capacitance suppression element section 50 may be designed so as to satisfy the expressions (5) and (6). The circuit configuration may be determined by a topology search method, for example. One example of a method for determining the circuit configuration by the topology search method is as follows.

By using any coefficient $a_n$ to $a_0$ ($a_n$, $a_0 \neq 0$), a polynomial expression expressed as $a_n(s^2)^n + a_{n-1}(s^2)^{n-1} + \ldots + a_0$ is defined as $D_n$. Please note that $s=j\omega$.

Similarly, a polynomial expression expressed as $a_n(p^2)^n + a_{n-1}(p^2)^{n-1} + \ldots + a_0$ is defined as $D_n$. Please note that $p=1/s$.

The circuit structure is obtained by applying following rules.

[Expression 23]

(Rule 1) \qquad (23)

$$s\frac{D_0}{D_0} \Rightarrow s$$

[Expression 24]

(Rule 2) (24)

$$\frac{sD_m}{D_n} \Rightarrow \begin{cases} sD_{m-n} + \frac{sD_{n-1}}{D_n} & (m \geq n) \\ s\frac{D_{m-n+k}}{D_k} + \frac{sD_{m-k}}{D_{n-k}} & (m < n), (n-m \leq k \leq m) \end{cases}$$

[Expression 25]

(Rule 3) (25)

$$\frac{D_m}{sD_n} \Rightarrow \begin{cases} sD_{m-n-1} + \frac{D_n}{sD_n} & (m > n) \\ \frac{D_{m-n+k}}{sD_k} + \frac{sD_{m-k-1}}{D_{n-k}} & (m \leq n), (n-m \leq k \leq m-1) \end{cases}$$

[Expression 26]

(Rule 4) (26)

$$\frac{sD_m}{D_n} \Rightarrow \frac{1}{\frac{D_n}{sD_m}}$$

[Expression 27]

(Rule 5) (27)

$$s \Leftrightarrow \frac{1}{p}$$

In the rules 1 to 4, arrows indicate the direction of expression transformation. The rule 5 indicates that s and 1/p can be mutually converted to each other.

In the expression (7), the circuit structure is obtained by substituting s=jω, and applying the rules 1 to 5 a plurality of times.

A case in which the above method is applied to the case of N=3 in FIG. 4 will be described. The expression (7) in the case of N=3 may be expressed as follows.

[Expression 28]

$$X(s) = \frac{D_3}{sD_2} \quad (28)$$

The right-hand side of the expression (28) can be transformed as follows by applying the rules 1 to 4 a plurality of times.

[Expression 29]

$$\frac{D_3}{sD_2} \Rightarrow sD_0 + \frac{D_2}{sD_2} \quad (29)$$

$$\Rightarrow s + \frac{D_0}{sD_0} + \frac{sD_1}{D_2}$$

$$\Rightarrow s + \frac{1}{s} + \frac{sD_0}{D_1} + \frac{sD_0}{D_1}$$

$$\Rightarrow s + \frac{1}{s} + \frac{1}{\frac{D_1}{sD_0}} + \frac{1}{\frac{D_1}{sD_0}}$$

$$\Rightarrow s + \frac{1}{s} + \frac{1}{s + \frac{1}{s}} + \frac{1}{s + \frac{1}{s}}$$

In the above transformation, the last expression corresponds to the expression (11). Accordingly, the circuit configuration in the case of N=3 in FIG. 4 can be obtained.

The number of elements of the capacitance suppression element section 50 is determined by the order of the harmonic to be suppressed, i.e., the value of N. In the capacitance suppression element section 50, the number of capacitance elements and the number of inductance elements are equal to each other. When the capacitance elements and the inductance elements are arranged between the opposite terminals 51 and 52 of the capacitance suppression element section 50, the capacitance elements and the inductance elements may be arranged according to following rules.

Rule A: Opposite ends of each element are connected to separate relay nodes or terminals.

Rule B: Three or more elements are not connected in parallel between two nodes.

Rule C: The same applies to a dual of the rule B.

Rule D: A closed path in which only two elements are connected in series from one node and return to the same node is not formed.

Rule E: When a plurality of partial two-terminal circuits are connected in series, the circuits in different order are regarded as the same circuits.

Rule F: A circuit in which one element is connected in parallel with remaining elements between the opposite terminals of the capacitance suppression element section 50 is excluded.

The circuit configuration of the capacitance suppression element section 50 can be determined more quickly by applying the above rules A to F.

In the switching circuit 10, the capacitance suppression element section 50 is connected to the semiconductor switch element 20. The capacitance suppression element section 50 is designed so as to satisfy the expressions (5) and (6) as described above. It is thus considered that the parasitic capacitance $C_X$ practically does not exist between the terminals of the semiconductor switch element 20 where the capacitance suppression element section 50 is connected up to the N-th order harmonic of the clock frequency $f_{CLK}$ of the PWM signal. That is, the parasitic capacitance $C_X$ is neutralized by the capacitance suppression element section 50. A time required to charge and discharge the parasitic capacitance $C_X$ can be thereby reduced, so that switching is performed at higher speed in the semiconductor switch element 20. As a result, the switching speed of the switching circuit 10 can be increased, and the power efficiency of the switching circuit 10 can be improved.

In the configuration shown in FIG. 1, the capacitance suppression element section 50a is connected between the gate terminal 21a and the drain terminal 22a of the semiconductor switch element 20a. Thus, the parasitic capacitance $C_{GD}$ of the semiconductor switch element 20a can be cancelled. Similarly, the parasitic capacitance $C_{GD}$ of the semiconductor switch element 20b can be cancelled by the capacitance suppression element section 50b.

Overdrive may be performed as a method for increasing the switching speed of the switching circuit 10 using the semiconductor switch element 20. However, in this case, the configuration of the drive circuit 30 may become complicated so as to perform the overdrive as compared to a case in which the overdrive is not performed. The drive circuit 30 also needs to have a higher ampacity so as to perform the overdrive. Accordingly, the drive circuit 30 may be increased in size, or the power efficiency of the switching circuit 10 including the drive circuit 30 may be reduced as compared to the case in which the overdrive is not performed. In this case, even when the high-speed switching is achieved by the overdrive, an improvement in the power efficiency by the high-speed switching itself may not be obtained.

Meanwhile, in the switching circuit 10, the capacitance suppression element section 50 neutralizes the parasitic capacitance $C_X$ itself to achieve the high-speed switching. Accordingly, the switching speed of the switching circuit 10 can be increased and the power efficiency can be improved as described above without performing the overdrive.

Although it is described that the capacitance suppression element section 50 can achieve the state in which the parasitic capacitance $C_X$ practically does not exist in the present embodiment, the capacitance suppression element section 50 only needs to reduce the influence of the parasitic capacitance $C_X$ when the capacitance suppression element section 50 is connected. For example, the circuit configuration of the capacitance suppression element section 50 and the element values of the elements of the capacitance suppression element section 50 may be set to values with which an equivalent capacitance of the terminal value where the capacitance suppression element section 50 is connected becomes 1/10 or less of the original parasitic capacitance $C_X$ by connecting the capacitance suppression element section 50. The element values of the elements of the capacitance suppression element section 50 may be also set to values with which the equivalent capacitance becomes half or less of the original parasitic capacitance $C_X$.

It is described that the switching circuit 10 includes the inductance element $L_L$ as the inductive load as one example in the present embodiment. When including such inductive load, the switching circuit 10 can be used for an inverter or the like. For example, by connecting a motor as the load instead of the inductance element $L_L$, the switching circuit 10 can be used for driving the motor.

Next, the change in the characteristics of the switching circuit 10 by the capacitance suppression element section 50 will be more specifically described by reference to simulation results. Simulations were performed by using NGSPICE.

Figure 9:
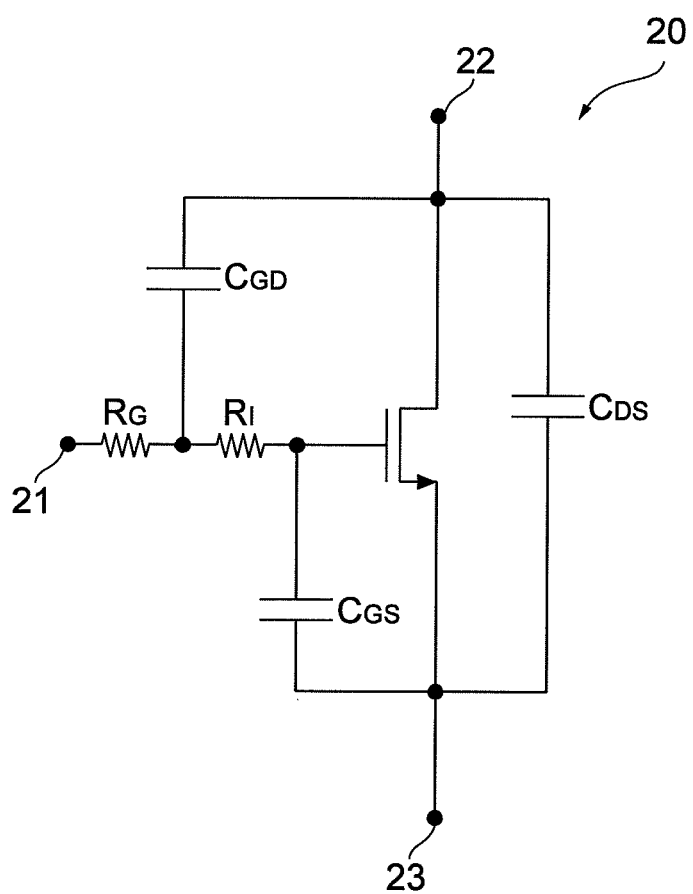
FIG. 9 is a model diagram of a semiconductor switch element for simulations.

FIG. 9 is a diagram illustrating a model of a semiconductor switch element for simulations. A MOS field-effect transistor was assumed to be used as the semiconductor switch element 20. It was assumed that parasitic resistances $R_G$ and $R_I$ existed in addition to the parasitic capacitances $C_{GS}$, $C_{DS}$, and $C_{GD}$ in the semiconductor switch element 20.

Device parameters of the semiconductor switch element 20 were set as follows.

Threshold voltage $V_T$=2 V
Transfer conductance parameter K=420 mS/V
Channel length modulation coefficient $\lambda$=0 mV$^{-1}$
Parasitic capacitance $C_{GS}$ between the gate and the source=700 pF
Parasitic capacitance $C_{DS}$ between the drain and the source=77 pF
Parasitic capacitance $C_{GD}$ between the gate and the drain=63 pF
Parasitic resistance $R_G$=1 mΩ
Parasitic resistance $R_I$=1 mΩ

Figure 10:
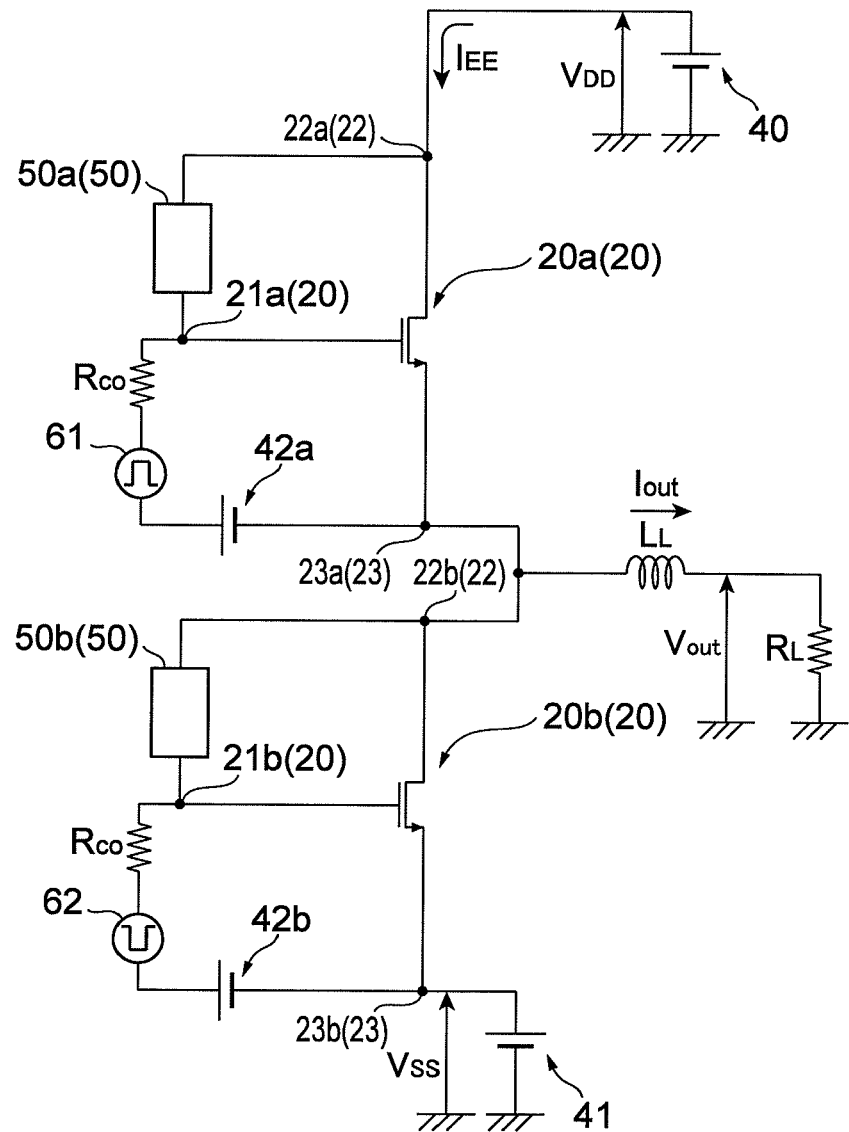
FIG. 10 is a circuit diagram for simulations corresponding to the switching circuit shown in FIG. 1.

FIG. 10 is a circuit diagram for simulations corresponding to the switching circuit 10 shown in FIG. 1. In the following, elements corresponding to those in FIG. 1 are assigned the same reference numerals for the convenience of description.

In FIG. 10, the first drive circuit section 31 and the second drive circuit section 32 of the drive circuit 30 shown in FIG. 1 are shown as signal sources 61 and 62 respectively corresponding to the semiconductor switch elements 20a and 20b. The semiconductor switch elements 20a and 20b respectively have the configuration shown in FIG. 9.

Element values or the like in a simulation circuit model shown in FIG. 10 were set as follows.

Clock frequency $f_{CLK}$ of the PWM signal supplied from the signal sources 61 and 62: 120 kHz Modulation frequency $f_M$ of the PWM signal supplied from the signal sources 61 and 62: 60 kHz Resistance value of the resistance $R_{CO}$ (Output impedance $R_{CO}$ of the signal sources 61 and 62 from the gate terminals 21a and 21b): 30Ω

Positive voltage $V_{DD}$ supplied to the drain terminal 22a: 400 V

Negative voltage $V_{SS}$ supplied to the source terminal 23b: −400 V

Voltage supplied to the signal sources 61 and 62 based on the source terminals 23a and 23b from the third power sources 42a, 42b: −13 V Element value (inductance) of the inductance element $L_L$: 2.5 mH Element value (resistance value) of the resistance $R_L$: 10Ω

The basic configuration shown in FIG. 4 was employed for the capacitance suppression element sections 50a and 50b. The element values of the respective elements of the capacitance suppression element sections 50a and 50b were designed by the aforementioned method with respect to each of the cases of N=1, 3, and 5.

The element values in the case of N=1, that is, when the parasitic capacitance $C_X$ is suppressed with respect to the clock frequency $f_{CLK}$ are as shown in Table 1.

TABLE 1

| | |
|---|---|
| $L_0$ [μH] | 22842.8 |
| $C_0$ [nF] | 886.7 |

The element values in the case of N=3, that is, when the parasitic capacitance $C_X$ is suppressed with respect to up to a third-order harmonic of the clock frequency $f_{CLK}$ are as shown in Table 2.

TABLE 2

| | |
|---|---|
| $L_0$ [μH] | 4138.4 |
| $C_0$ [nF] | 885.1 |
| $L_1$ [μH] | 4031.5 |
| $C_1$ [nF] | 0.1 |
| $L_2$ [μH] | 426.7 |
| $C_2$ [nF] | 0.9 |

The element values in the case of N=5, that is, when the parasitic capacitance $C_X$ is suppressed with respect to up to a fifth-order harmonic of the clock frequency $f_{CLK}$ are as shown in Table 3.

TABLE 3

| | |
|---|---|
| $L_0$ [μH] | 1367.4 |
| $C_0$ [nF] | 884.7 |
| $L_1$ [μH] | 3576.9 |
| $C_1$ [nF] | 0.4 |
| $L_2$ [μH] | 521.8 |
| $C_2$ [nF] | 0.8 |
| $L_3$ [μH] | 136.4 |
| $C_3$ [nF] | 1.3 |
| $L_4$ [μH] | 36.5 |
| $C_4$ [nF] | 2.9 |

Next simulations 1 and 2 were performed as the simulation on the above conditions. In the following simulations 1 and 2, a voltage to a connection point between the inductance $L_L$ and the resistance $R_L$ was set as an output voltage $V_{out}$.

[Simulation 1]

In the simulation 1, power efficiency was calculated in simulations 1a and 1b based on conditions described below.

The power efficiency was calculated by (output voltage $V_{out}$×output current $I_{out}$)/(supply voltage $V_{DD}$×supply current $I_{EE}$)×100(%). Here, the output current $I_{out}$ is a current flowing through the inductance $L_L$. The supply current $I_{EE}$ is a current flowing into the drain terminal 22a.

(Simulation 1a)

The simulation was performed with $C_{GS}$=700 pF, $C_{GD}$=0, and $C_{DS}$=77 pF. The power efficiency in this case was 96%.

(Simulation 1b)

The simulation was performed with $C_{GS}$=700 pF, $C_{GD}$=63 pF, and $C_{DS}$=77 pF. The power efficiency in this case was 89%.

By comparing the result of the simulation 1a and the result of the simulation 1b, it has been found that the power efficiency can be improved by reducing the parasitic capacitance of the semiconductor switch element 20 (the parasitic capacitance $C_{GD}$ in the simulation 1a as one example).

[Simulation 2]

In the simulation 2, simulations 2a to 2c were performed such that the parasitic capacitance $C_{GD}$ was suppressed by use of the capacitance suppression element section 50 by setting the values of the parasitic capacitances $C_{GD}$, $C_{GS}$, and $C_{DS}$ of the semiconductor switch element 20 to the values indicated as the device parameters above. A simulation 2d was also performed for comparison as a case in which the capacitance suppression element section 50 was not connected.

(Simulation 2a)

The simulation was performed by employing the configuration in the case of N=1 as the configuration of the capacitance suppression element section 50, and power efficiency and time ratio were calculated. Total harmonic distortion (MD) was also calculated so as to examine the influence of the capacitance suppression element section on the THD.

(Simulation 2b)

The simulation was performed by employing the configuration in the case of N=3 as the configuration of the capacitance suppression element section 50, and power efficiency and time ratio were calculated. THD was also calculated in the present simulation in a similar manner to the simulation 2a.

(Simulation 2c)

The simulation was performed by employing the configuration in the case of N=5 as the configuration of the capacitance suppression element section 50, and power efficiency and time ratio were calculated. THD was also calculated in the present simulation in a similar manner to the simulation 2a.

(Simulation 2d)

The simulation was performed for the case in which the capacitance suppression element section 50 was not connected, and power efficiency and time ratio were calculated.

Figure 11:
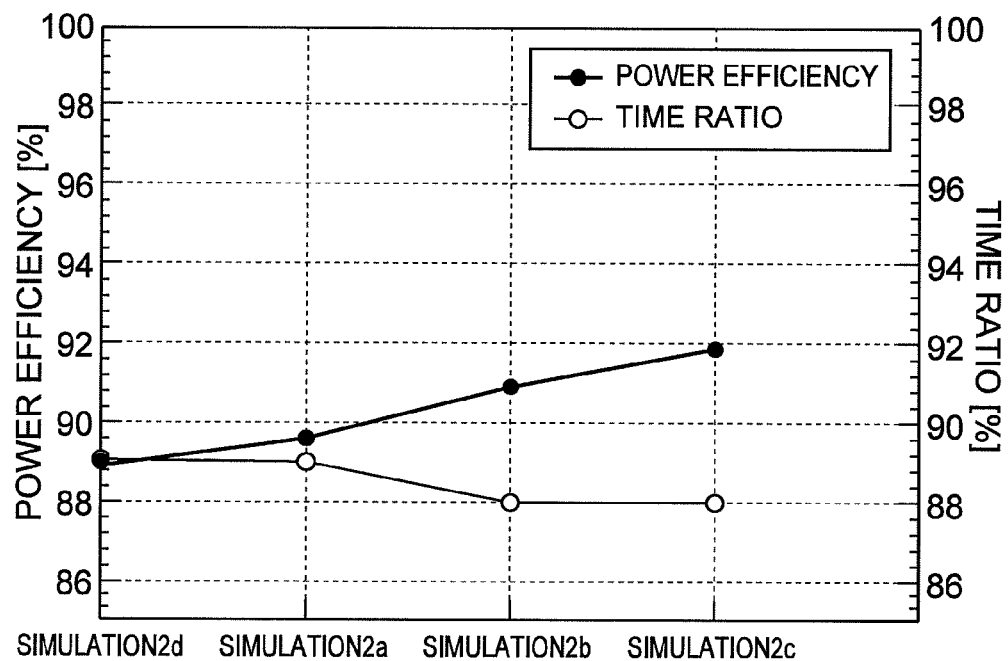
FIG. 11 is a graph showing calculation results of power efficiency and time ratio in simulations according to the first embodiment.

FIG. 11 is a graph showing the calculation results of the power efficiency and the time ratio in the simulations 2a to 2d. A horizontal axis represents the performed simulations. A vertical axis represents the power efficiency (%) and the time ratio (%).

From FIG. 11, it can be understood that the power efficiency and the time ratio are both improved in the simulations 2a, 2b, and 2c using the capacitance suppression element section 50 as compared to the result of the simulation 2d in which the parasitic capacitance $C_{GD}$ is not cancelled by the capacitance suppression element section 50.

Figure 12:
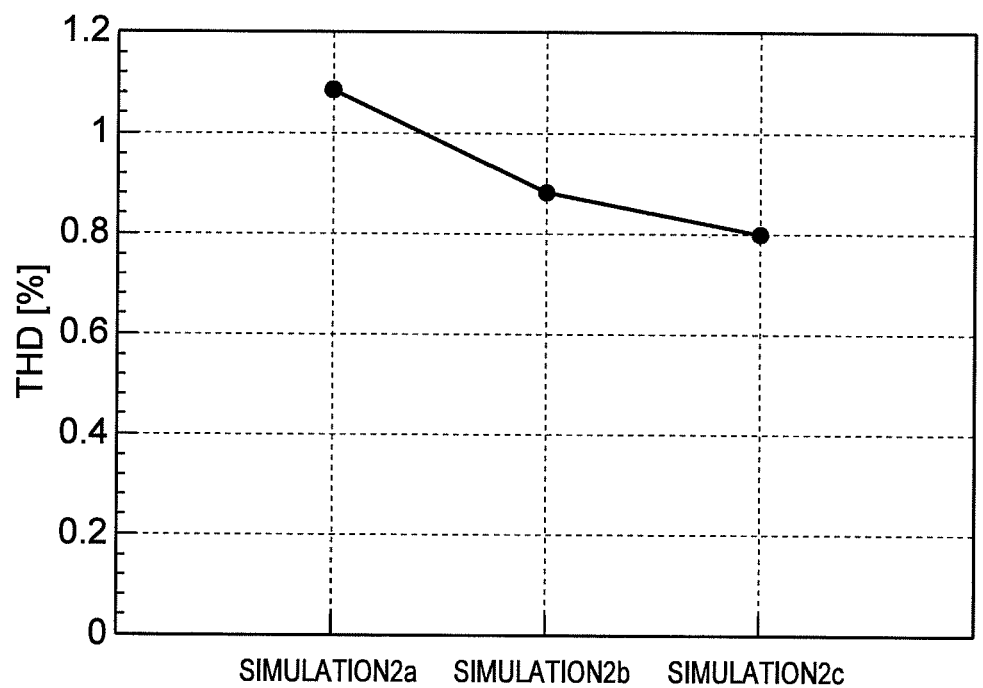
FIG. 12 is a graph showing calculation results of total harmonic distortion (THD) in the simulations according to the first embodiment.

FIG. 12 is a graph showing the calculation results of the THD in the simulations 2a, 2b, and 2c. A horizontal axis represents the performed simulations. A vertical axis represents the total harmonic distortion: THD (%). As shown in FIG. 12, it can be understood that as the order of the harmonic of the clock frequency $f_{CLK}$ increases, the THD decreases when the capacitance suppression element section 50 is provided. Accordingly, it is understood that an increase in the THD can be reduced in the switching circuit 10 including the capacitance suppression element section 50.

Second Embodiment

Figure 13:
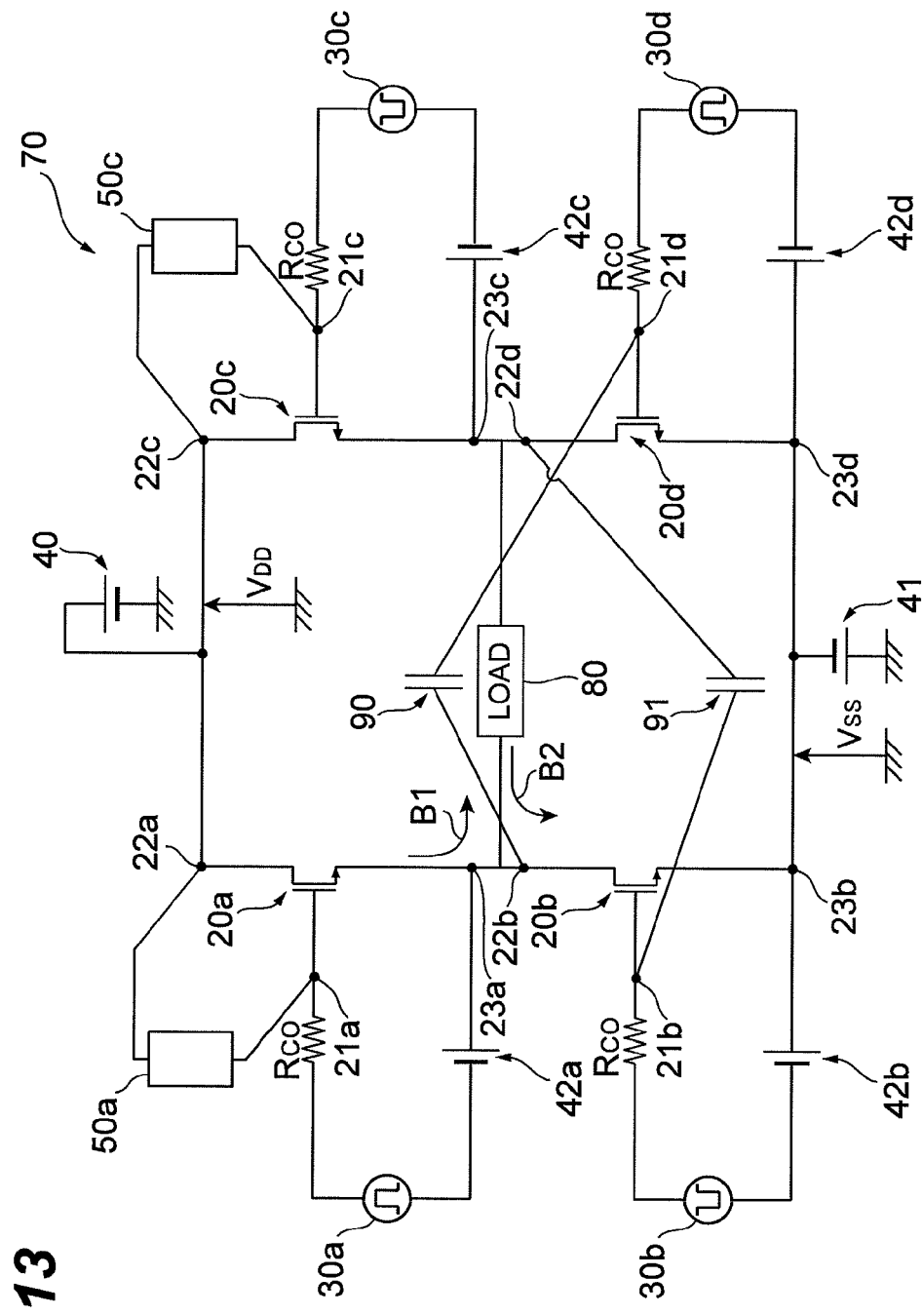
FIG. 13 is a circuit diagram illustrating the schematic configuration of a switching circuit according to a second embodiment.

FIG. 13 is a circuit diagram illustrating the schematic configuration of a switching circuit according to a second embodiment of the present invention. A switching circuit 70 is a differential switching circuit.

The switching circuit 70 includes four semiconductor switch elements 20a, 20b, 20c, and 20d. All the semiconductor switch elements 20a to 20d are the same semiconductor switch element as that of the first embodiment. In the following description, the semiconductor switch elements 20a to 20d may be sometimes referred to as semiconductor switch element 20 in a similar manner to the case of the first embodiment. The switching circuit 70 may include drive circuits 30a, 30b, 30c, and 30d that respectively supply PWM signals to gate terminals 21a, 21b, 21c, and 21d of the semiconductor switch elements 20a, 20b, 20c, and 20d. Although the drive circuits 30a, 30b, 30c, and 30d are respectively connected to the four semiconductor switch elements 20a, 20b, 20c, and 20d in FIG. 11, only one drive circuit 30 may be employed as in the case of the first embodiment. The drive circuit 30a and the drive circuit 30b correspond to the first drive circuit section 31 and the second drive circuit section 32.

The configuration of the switching circuit 70 will be described. A drain terminal (an output terminal) 22a of the semiconductor switch element (a first semiconductor switch element) 20a and a drain terminal (an output terminal) 22c of the semiconductor switch element (a third semiconductor switch element) 20c are connected to each other. A source terminal (a common terminal) 23b of the semiconductor switch element (a second semiconductor switch element) 20b and a source terminal (a common terminal) 23d of the semiconductor switch element (a fourth semiconductor switch element) 20d are connected to each other. A first power source 40 and a second power source 41 are respectively connected to a connection point between the drain terminal 22a and the drain terminal 22c, and a connection point between the source terminal 23b and the source terminal 23d. The first power source 40 supplies a positive voltage $V_{DD}$ to the drain terminals 22a and 22c. The second power source 41 supplies a negative voltage $V_{SS}$ to the source terminals 23b and 23d.

The semiconductor switch elements 20a and 20b are connected in series in a similar manner to the first embodiment. Similarly, the semiconductor switch elements 20c and 20d are also connected in series. That is, a source terminal 23c of the semiconductor switch element 20c and a drain terminal 22d of the semiconductor switch element 20d are connected to each other. A connection point between a source terminal 23a and a drain terminal 22b, and a connection point between the source terminal 23c and the drain terminal 22d are connected via a load 80. The load 80 may be an inductive load such as an inductance element in a similar manner to the first embodiment, or may be a resistive load. For example, when a motor is connected as the load 80, the motor may be driven.

The drive circuits 30a and 30d respectively supply positive-phase PWM signals to the gate terminals 21a and 21d of the semiconductor switch elements 20a and 20d. Similarly, the drive circuits 30b and 30c respectively supply negative-phase PWM signals to the gate terminals 21b and 21c of the semiconductor switch elements 20b and 20c. The PWM signals supplied to the gate terminals 21a to 21d have the same clock frequency $f_{CLK}$. Resistances $R_{CO}$ between the respective semiconductor switch elements 20a to 20d and the corresponding drive circuits 30a to 30d represent output impedances of the drive circuits 30a to 30d respectively connected to the gate terminals 21a to 21d of the semiconductor switch elements 20a to 20d. Third power sources 42a to 42d are respectively connected between the source terminals 23a to 23d of the semiconductor switch elements 20a to 20d and the drive circuits 30a to 30d. Positive poles of the third power sources 42a to 42d are connected to the corresponding source terminals 23a to 23d. Negative poles of the third power sources 42a to 42d are connected to the corresponding drive circuits 30a to 30d. Accordingly, predetermined negative voltages based on the source terminals 23a to 23d are supplied to the drive circuits 30a to 30d in a similar manner to the first embodiment. The magnitude of the predetermined negative voltage may be equal to that of the negative voltage supplied from the third power source 42a or 42b in the first embodiment.

In the above configuration, while the drive circuits 30a and 30d supply the positive-phase PWM signals to the semiconductor switch elements 20a and 20d, the drive circuits 30b and 30c supply the negative-phase PWM signals to the semiconductor switch elements 20b and 20c. Thus, when the semiconductor switch elements 20a and 20d are in an ON state, the semiconductor switch elements 20b and 20c are in an OFF state. A current flows in the direction of an arrow B1 in FIG. 13. Meanwhile, when the semiconductor switch elements 20a and 20d are in the OFF state, the semiconductor switch elements 20b and 20c are in the ON state. A current flows in the direction of an arrow B2 in FIG. 13. Accordingly, the direction of a current flowing through the load 80 can be switched according to the PWM signals.

To improve the power efficiency in accordance with the switching, capacitance suppression element sections 50a and 50c are connected, at least one by one, to the semiconductor switch elements 20a and 20c so as to suppress at least one of three parasitic capacitances $C_{GS}$, $C_{GD}$, and $C_{DS}$ of the semiconductor switch elements 20a and 20c. The capacitance suppression element sections 50a and 50c are respectively connected between the terminals where a parasitic capacitance $C_X$ to be suppressed exists. FIG. 13 shows a configuration in which the capacitance suppression element sections 50a and 50c are respectively connected between the gate terminals 21a and 21c and the drain terminals 22a and 22c of the semiconductor switch elements 20a and 20c. Since the capacitance suppression element sections 50a and 50c have the same circuit configuration as that of the first embodiment, the description thereof is omitted. In the following description, the capacitance suppression element sections 50a and 50c may be sometimes referred to as capacitance suppression element section 50 in a similar manner to the case of the first embodiment.

In the switching circuit 70, capacitance elements 90 and 91 are further respectively connected between the drain terminal 22b of the semiconductor switch element 20b and the gate terminal 21d of the semiconductor switch element 20d, and between the gate terminal 21b of the semiconductor switch element 20b and the drain terminal 22d of the semiconductor switch element 20d. A capacitance $C_{90}$ of the capacitance element (a first capacitance element) 90 is substantially equal to the parasitic capacitance $C_{GD}$ between the gate terminal 21d and the drain terminal 22d of the semiconductor switch element 20d at an N-th order harmonic of the PWM signal. Similarly, a capacitance $C_{91}$ of the capacitance element (a second capacitance element) 91 is substantially equal to the parasitic capacitance $C_{GD}$ between the gate terminal 21b and the drain terminal 22b of the semiconductor switch element 20b.

By connecting the capacitance elements 90 and 91 as described above, the respective parasitic capacitances $C_{GD}$ of the semiconductor switch elements 20d and 20b can be suppressed. This point will be described by reference to FIG. 14.

Figure 14:
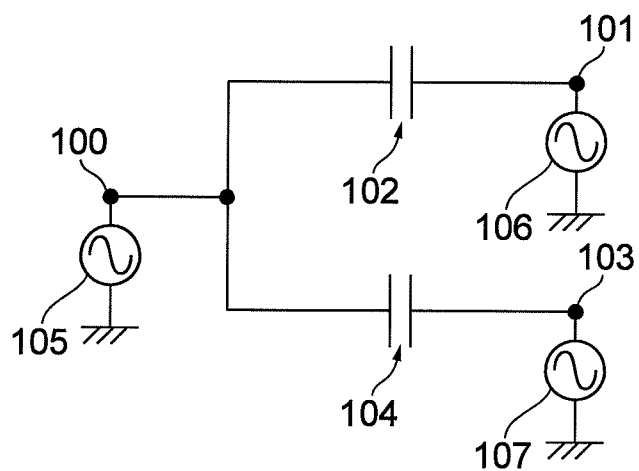
FIG. 14 is a diagram for explaining the principle that a parasitic capacitance of a semiconductor switch element can be suppressed by connecting a capacitance element.

FIG. 14 is a diagram for explaining the principle that the parasitic capacitance of the semiconductor switch element can be suppressed by connecting the capacitance element. FIG. 14 is a model diagram for calculating a capacitance component anticipated from the gate terminal 21d in the semiconductor switch element 20d having a differential circuit.

In a circuit model shown in FIG. 14, a capacitance element 102 is connected between a first terminal 100 and a second terminal 101, and a capacitance element 104 having the same capacitance as that of the capacitance element 102 is connected between the first terminal 100 and a third terminal 103. The capacitance element 102 represents the parasitic capacitance $C_{GD}$, and the capacitance element 104 corresponds to the capacitance element 90. A signal source 105 is connected to the first terminal 100, and voltage sources 106 and 107 are respectively connected to the second terminal 101 and the third terminal 103.

In the model shown in FIG. 14, the first terminal 100 corresponds to the gate terminal 21d of the semiconductor switch element 20d. The signal source 105 supplies a gate voltage $V_X$ to the first terminal 100 so as to represent the input of the PWM signal into the gate terminal 21d. The second terminal 101 corresponds to the drain terminal 22d of the semiconductor switch element 20d. The voltage source 106 supplies a voltage $V_D$ to the second terminal 101 so as to represent the voltage of the drain terminal 22d. The third terminal 103 corresponds to the drain terminal 22b of the semiconductor switch element 20b. It is assumed that a drain potential of the drain terminal 22b of the semiconductor switch element 20b is opposite to a drain potential of the drain terminal 22d of the semiconductor switch element 20d. Thus, a drain voltage ($-V_D$) is supplied to the third terminal 103 from the voltage source 107.

An amount of charge flowing into the first terminal 100 as the gate terminal 21d from the second terminal 101 and the third terminal 103 is $C_{GD}(V_D-V_X)+C_{GD}(-V_D-V_X)=-2C_{GD}V_X$. Thus, the parasitic capacitance $C_{GD}$ between the gate and the drain equivalently does not exist, and it appears that a capacitance having the value of $2C_{GD}$ exists between the gate terminal 21d and the ground (that is, the source terminal).

As described above, when the capacitance element 90 is provided as shown in FIG. 13, the parasitic capacitance $C_{GD}$ between the gate and the drain equivalently does not exist at the N-th order harmonic (a so-called fundamental wave in a case of N=1) of the PWM signal. Thus, the influence of the parasitic capacitance $C_{GD}$ of the semiconductor switch element 20d can be neutralized or cancelled. Although the semiconductor switch element 20d has been mainly described here, the same applies to the semiconductor switch element 20b. That is, when the capacitance element 91 is provided as shown in FIG. 13, the influence of the parasitic capacitance $C_{GD}$ of the semiconductor switch element 20b can be neutralized or cancelled at the N-th order harmonic of the PWM signal. The parasitic capacitance $C_{GD}$ between the gate and the drain affects the switching speed the most in the semiconductor switch elements 20a to 20d. Thus, when the influence of the parasitic capacitance $C_{GD}$ between the gate and the drain is reduced in the semiconductor switch elements 20b and 20d, the switching speeds of the semiconductor switch elements 20b and 20d can be increased.

Although it is described that the capacitance elements 90 and 91 neutralize the influence of the parasitic capacitance $C_{GD}$, the capacitance elements 90 and 91 only need to reduce or suppress the influence of the parasitic capacitance $C_{GD}$. For example, the capacitances of the capacitance elements 90 and 91 may be set to values with which an equivalent capacitance becomes 1/10 or less of the original parasitic capacitance $C_X$ by connecting the capacitance elements 90 and 91 as described in the first embodiment. The capacitances of the capacitance elements 90 and 91 may be also set to values with which the equivalent capacitance becomes half or less of the original parasitic capacitance $C_X$.

In the switching circuit 70, the capacitance suppression element sections 50a and 50c reduce the influence of the parasitic capacitance $C_{GD}$ with respect to the semiconductor switch elements 20a and 20c. The capacitance elements 90 and 91 reduce the influence of the parasitic capacitance $C_{GD}$ with respect to the semiconductor switch elements 20b and 20d. As a result, the switching speeds of the semiconductor switch elements 20a to 20d can be increased, and the power efficiency can be improved in a similar manner to the case of the first embodiment. Since the influence of the parasitic capacitance $C_{GD}$ is reduced by using the capacitance suppression element sections 50a and 50c, and the capacitance elements 90 and 91, the switching speed and the power efficiency can be improved without performing overdrive in a similar manner to the case of the first embodiment. Moreover, since the capacitance elements 90 and 91 are used to reduce the influence of the parasitic capacitance $C_{GD}$ with respect to the semiconductor switch elements 20b and 20d, the switching circuit 70 can be more easily designed. Accordingly, the configuration of the switching circuit 70 is more effectively employed when there is a difference in device parameters of the semiconductor switch elements 20a to 20d.

The point that the power efficiency can be improved in the switching circuit 70 will be described by reference to simulation results.

Figure 15:
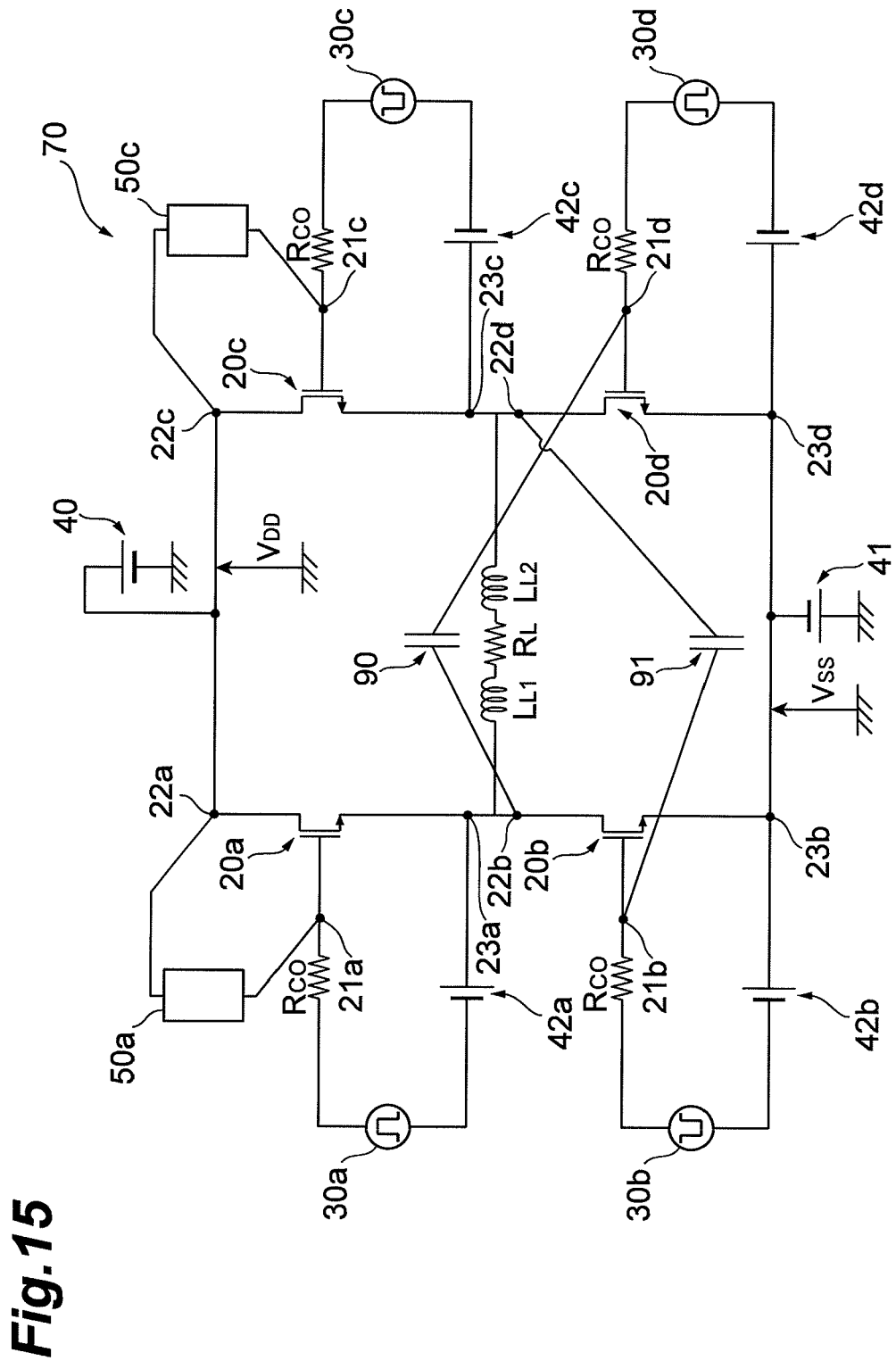
FIG. 15 is a model diagram for simulations corresponding to the switching circuit shown in FIG. 13.

FIG. 15 is a model diagram for simulations corresponding to the switching circuit 70 shown in FIG. 13. In the following, elements corresponding to those in FIG. 13 are assigned the same reference numerals for the convenience of description. In a circuit model shown in FIG. 15, the load 80 is represented by a series circuit of an inductance element $L_{L1}$, a resistance $R_L$, and an inductance element $L_{L2}$. In simulations, a voltage to the ground of the connection point between the source terminal 23a of the semiconductor switch element 20a and the drain terminal 22b of the semiconductor switch element 20b was set as an output voltage $V_{out}$. In the simulation circuit model, the semiconductor switch elements 20a to 20d had the configuration shown in FIG. 9 in a similar manner to the first embodiment. The device parameters of the semiconductor switch elements 20a to 20d were the same as the device parameters described in the first embodiment. The capacitance elements 90 and 91 had a capacitance of 63 pF similarly to the capacitance $C_{GD}$.

Element values or the like in the simulation circuit model shown in FIG. 15 were set as follows.

Clock frequency $f_{CLK}$ of the PWM signal supplied from the drive circuits 30a to 30d: 120 kHz Modulation frequency $f_M$ of the PWM signal supplied from the drive circuits 30a to 30d: 60 kHz Resistance value of the resistance $R_{CO}$: 30Ω

Positive voltage $V_{DD}$ supplied to the drain terminals 22a and 22c: 400 V

Negative voltage $V_{SS}$ supplied to the source terminals 23b and 23d: −400 V

Voltage supplied to the drive circuits 30a to 30d based on the source terminals 23a to 23d from the third power sources 42a to 42d: −13 V Element value (inductance) of the inductance elements $L_{L1}$ and $L_{L2}$: 2.5×½ mH Element value (resistance value) of the resistance $R_L$: 10Ω

Following simulations 3, 4, 5, and 6 were performed as the simulation.

[Simulation 3]

The simulation was performed by assuming a case in which none of the capacitance elements 90 and 91 and the capacitance suppression element sections 50a and 50c was connected. In the simulation, all the parasitic capacitances of each of the semiconductor switch elements 20a to 20d were set to the values indicated as the device parameters.

[Simulation 4]

The simulation was performed by assuming a case in which the parasitic capacitance $C_{GD}$ between the gate and the drain of each of the semiconductor switch elements 20 was cancelled by the capacitance elements 90 and 91 and the capacitance suppression element sections 50a and 50c. In the simulation, the parasitic capacitance $C_{GD}$ of each of the semiconductor switch elements 20a to 20d was set to 0 as an ideal state.

[Simulation 5]

The simulation was performed by assuming that the parasitic capacitances $C_{GD}$ of the semiconductor switch elements 20a to 20d were neutralized by the capacitance suppression element sections 50 without providing the capacitance elements 90 and 91. Thus, in the simulation, the parasitic capacitance $C_{GD}$ was set to 0.

[Simulation 6]

The simulation was performed on the same conditions as the simulation 3 except that the capacitance elements 90 and 91 were connected.

FIGS. 16 to 19 are graphs respectively showing the results of the simulations 3 to 6. FIGS. 16 to 19 show changes in voltages $V_{GS1a}$ and $V_{GS2a}$ between the gate and the source of the semiconductor switch element 20 and the output voltage $V_{out}$ with respect to time. A horizontal axis represents the time [μs], and a vertical axis represents the voltages $V_{GS}$ [V] between the gate and the source and the output voltage $V_{out}$ [V]. FIGS. 16 to 19 show $V_{GSa}$ as $V_{GS}$ in the semiconductor switch element 20a at an upper left position in FIG. 15, $V_{GSb}$ as $V_{GS}$ in the semiconductor switch element 20b at a lower left position in FIG. 15, and the output voltage $V_{out}$ as the voltage to the ground of the connection point between the semiconductor switch element 20a and the semiconductor switch element 20b.

Figure 16:
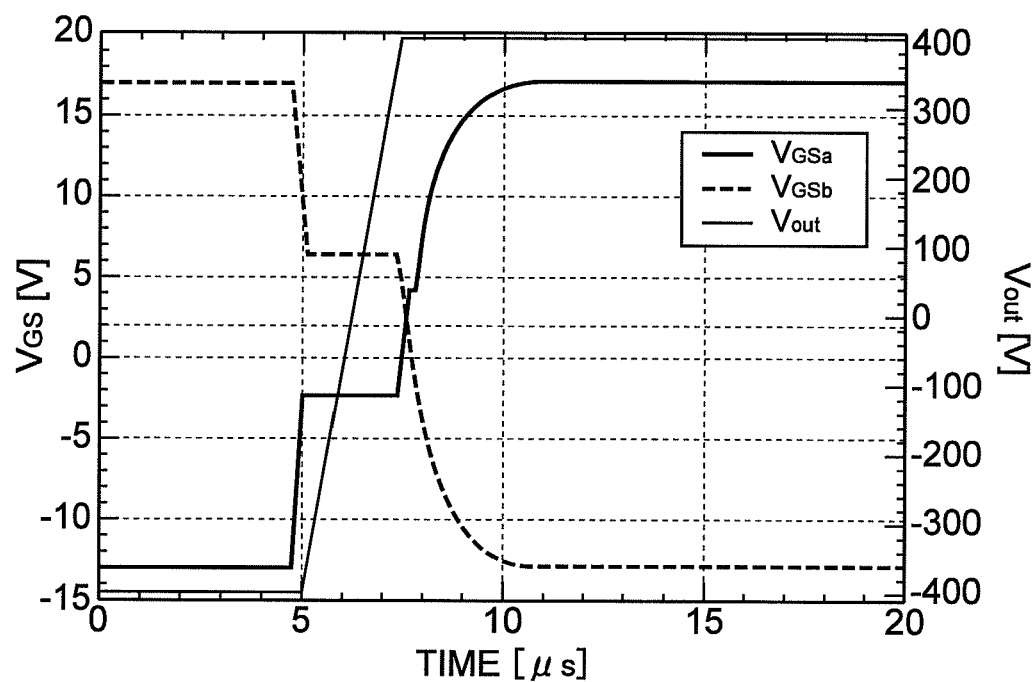
FIG. 16 is a graph showing a simulation result of a case in which each of four semiconductor switch elements shown in FIG. 15 has all parasitic capacitances.
Figure 17:
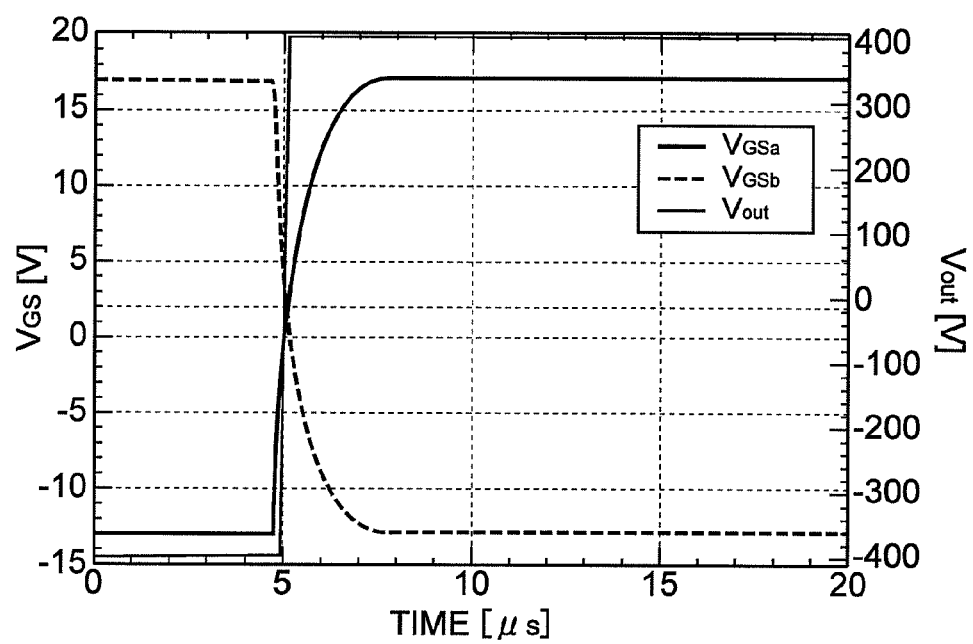
FIG. 17 is a graph showing a simulation result of a case in which parasitic capacitances $C_{GD}$ of the four semiconductor switch elements shown in FIG. 15 are 0.
Figure 18:
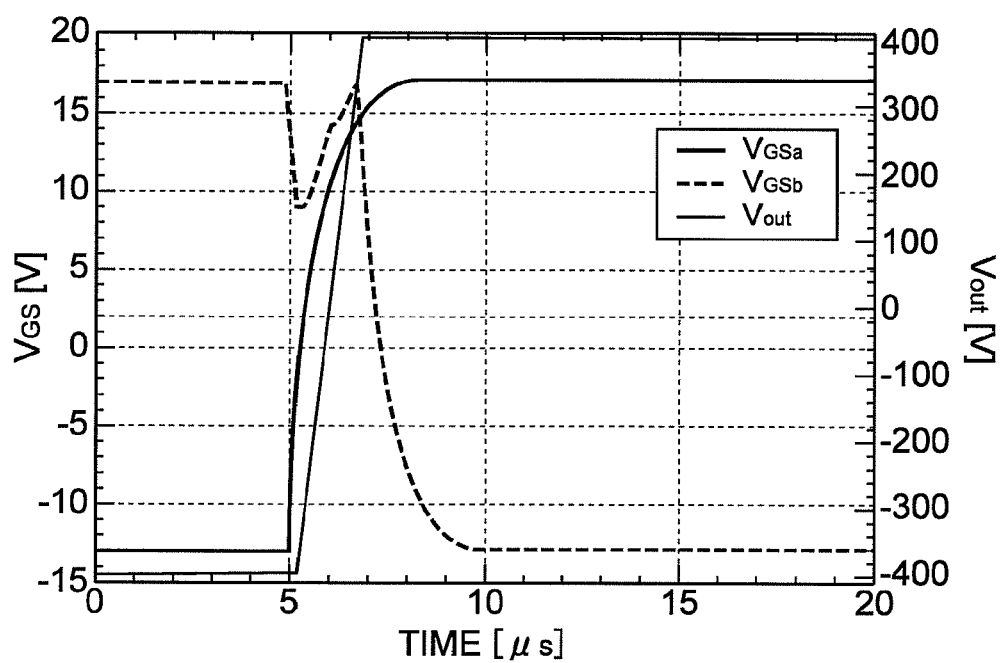
FIG. 18 is a graph showing a simulation result of a case in which parasitic capacitances $C_{GD}$ of upper two semiconductor switch elements shown in FIG. 15 are 0.

By comparing FIGS. 16, 17, and 18, it can be understood that there is a more rapid voltage change, particularly, a more rapid change in the output voltage $V_{out}$ than that in the case shown in FIG. 16 by providing the capacitance suppression element sections 50a and 50c and thereby cancelling the parasitic capacitances $C_{GD}$ of the semiconductor switch elements 20a and 20c, so that the results shown in FIG. 18 approaches to an ideal state shown in FIG. 17.

Figure 19:
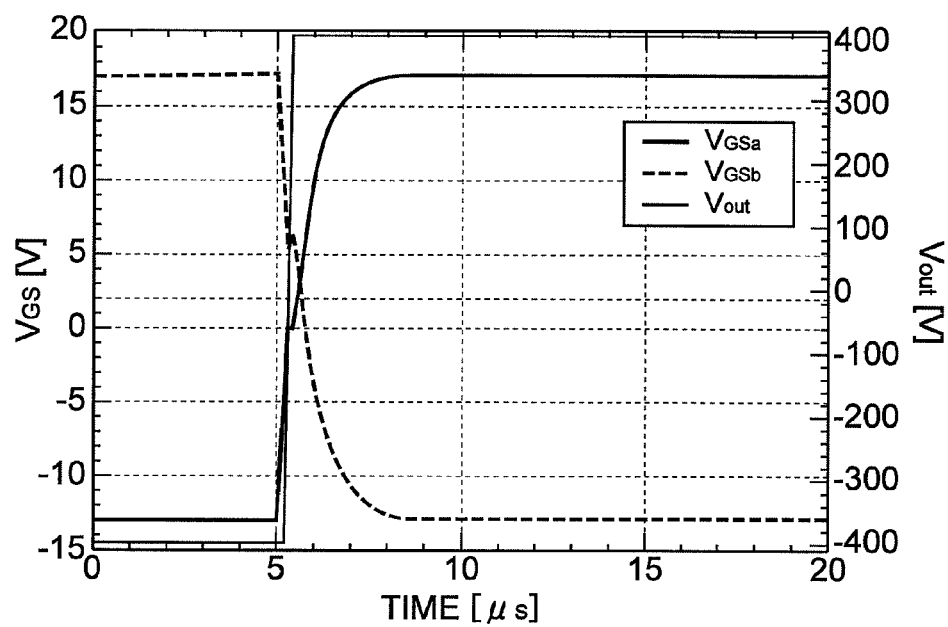
FIG. 19 is a graph showing a simulation result of a case in which the parasitic capacitances $C_{GD}$ of the upper two semiconductor switch elements shown in FIG. 15 are 0, and the capacitance element is assumed to be connected.

Also, by comparing FIGS. 17, 18, and 19, it can be understood that there is a still more rapid voltage change, particularly, a still more rapid change in the output voltage $V_{out}$ than that in the case shown in FIG. 18 by providing the capacitance suppression element sections 50 and also connecting the capacitance elements, so that the results shown in FIG. 19 approaches to an ideal state shown in FIG. 17.

Although the example in which the capacitance elements 90 and 91 reduce the parasitic capacitances $C_X$ of the semiconductor switch elements 20b and 20d has been described in the second embodiment, the capacitance suppression element section may be also used to reduce the parasitic capacitance with respect to the semiconductor switch elements 20b and 20d instead of the capacitance elements 90 and 91. Also, the influence of the capacitance having the value of $2C_{GD}$ as the capacitance between the gate terminals 21d and 21b and the grounds (the source terminals) appearing to equivalently exist by the capacitance elements 90 and 91 may be substantially reduced by further connecting the capacitance suppression element section. At least one of the parasitic capacitances $C_X$ of the semiconductor switch elements 20b and 20d may be reduced by combination of the capacitance suppression element section and the capacitance elements 90 and 91.

Although various embodiments of the present invention have been described above, the present invention is not limited to the various embodiments described above, and various modifications may be made without departing from the scope of the present invention. For example, the semiconductor switch element of the switching circuit is not limited to the MOS field-effect transistor described above. For example, the semiconductor switch element may be an insulated gate bipolar transistor, a junction field-effect transistor, or a junction bipolar transistor. Alternatively, the semiconductor switch element may be a thyristor. When the semiconductor switch element is the insulated gate bipolar transistor or the junction bipolar transistor, the semiconductor switch element has a gate terminal as the input terminal, a collector terminal as the output terminal, and an emitter terminal as the common terminal. When the semiconductor switch element is the junction field-effect transistor, the semiconductor switch element has a gate terminal as the input terminal, a drain terminal as the output terminal, and a source terminal as the common terminal in a similar manner to the case of the MOS field-effect transistor. When the semiconductor switch element is the thyristor, the semiconductor switch element has a gate terminal as the input terminal, an anode terminal as the output terminal, and a cathode terminal as the common terminal.

Although it is described that the plurality of semiconductor switch elements of the switching circuit have the same configuration, the plurality of semiconductor switch elements may have different configurations. The capacitance suppression element sections respectively connected to the plurality of semiconductor switch elements may also have different configurations. The number of semiconductor switch elements of the switching circuit is also not limited to 2 or 4 described above. The switching circuit only needs to have at least one semiconductor switch element.

Although the pulse-like signal supplied to the semiconductor switch element is the PWM signal in the various embodiments described above, any pulse-like signal may be employed as long as the ON/OFF switching of the semiconductor switch element can be controlled.

What is claimed is:

1. A switching circuit comprising at least one semiconductor switch element having an input terminal, an output terminal, and a common terminal, a pulse-like signal being applied between the input terminal and the common terminal to switch a current between the output terminal and the common terminal, further comprising a capacitance suppression element section connected at least one of between the input terminal and the output terminal, between the input terminal and the common terminal, and between the output terminal and the common terminal, wherein the capacitance suppression element section reduces a parasitic capacitance between the terminals of the semiconductor switch element, where the capacitance suppression element section is connected, to less than that obtained when the capacitance suppression element section is not connected, at a frequency N times (N is an integer of 1 or more) as high as a clock frequency of the pulse-like signal, wherein the pulse-like signal is a PWM signal, and wherein the capacitance suppression element section is configured to satisfy expressions (1) and (2) when a reactance of the capacitance suppression element section is a function $X(\omega)$ of an angular frequency:

[Expression 1]

$$jX(n\varpi_0) = -\frac{1}{jn\varpi_0 C_X}(n = 1, 2, \ldots, N) \quad (1)$$

[Expression 2]

$$\left|\frac{1}{jn\varpi_0 C_X + \frac{1}{jX(\varpi_M)}}\right| = \alpha R_{CO}(\alpha \gg 1) \quad (2)$$

(in the expressions (1) and (2), j represents an imaginary unit, $\omega_0$ represents a product of a clock frequency of the PWM signal and $2\pi$, $\omega_M$ represents a product of a modulation frequency of the PWM signal and $2\pi$, $C_X$ represents a parasitic capacitance between the terminals of the semiconductor switch element as the parasitic capacitance between the terminals of the semiconductor switch element where the capacitance suppression element section is connected, $R_{CO}$ represents an output impedance of a drive circuit that is connected to the input terminal of the semiconductor switch element where the capacitance suppression element section is connected and supplies the PWM signal).

2. The switching circuit according to claim 1, wherein the function $X(\omega)$ is expressed by an expression (3):

[Expression 3]

$$jX(\varpi) = \frac{\beta(-\varpi^2 + \varpi_{z0}^2)(-\varpi^2 + \varpi_{z1}^2) \ldots (-\varpi^2 + \varpi_{zN-1}^2)}{j\omega(-\varpi^2 + \varpi_{p1}^2) \ldots (-\varpi^2 + \varpi_{pN-1}^2)} \quad (3)$$

(in the expression (3), when t is an integer of 1 to N−1, $\omega_{z0}$ is a value that satisfies $0<\omega_{z0}<\omega_0$, $\omega_{zt}$ and $\omega_{pt}$ are values that satisfy $t\omega_0<\omega_{pt}<\omega_{zt}<(t+1)\omega_0$, and $\beta$ is any value).

3. The switching circuit according to claim 2, wherein the capacitance suppression element section is connected between the input terminal and the output terminal of the semiconductor switch element.

4. The switching circuit according to claim 1, wherein N is 2 or more, the capacitance suppression element section has first to N-th circuit sections connected in series, the first circuit section is composed of an inductance element and a capacitance element connected in series, and an i-th circuit section (i is an integer of 2 to N) out of the second to N-th circuit sections is composed of an inductance element and a capacitance element connected in parallel.

5. The switching circuit according to claim 4,
wherein when element values of the inductance element and the capacitance element of the first circuit section are respectively $L_0$ and $C_0$, and element values of the inductance element and the capacitance element of the i-th circuit section are respectively $L_{i-1}$ and $C_{i-1}$,
the element values of the inductance element and the capacitance element of the first circuit section and an element value of a capacitance element of each of the second to N-th circuit sections satisfy an expression (4), and
$L_{i-1}$ is $1/(C_{i-1}(\omega_{p(i-1)})^2)$:

[Expression 4]

$$\begin{bmatrix} \varpi_0 & \frac{-1}{\varpi_0} & \frac{\varpi_0}{-\varpi_0^2 + \varpi_{p1}^2} & \cdots & \frac{\varpi_0}{-\varpi_0^2 + \varpi_{pN-1}^2} \\ N\varpi_0 & \frac{-1}{2\varpi_0} & \frac{2\varpi_0}{-2^2\varpi_0^2 + \varpi_{p1}^2} & \cdots & \frac{2\varpi_0}{-2^2\varpi_0^2 + \varpi_{pN-1}^2} \\ \vdots & \vdots & \vdots & \ddots & \vdots \\ N\varpi_0 & \frac{-1}{N\varpi_0} & \frac{N\varpi_0}{-N^2\varpi_0^2 + \varpi_{p1}^2} & \cdots & \frac{N\varpi_0}{-N^2\varpi_0^2 + \varpi_{pN-1}^2} \\ \varpi_M & \frac{-1}{\varpi_M} & \frac{\varpi_M}{-\varpi_M^2 + \varpi_{p1}^2} & \cdots & \frac{\varpi_M}{-\varpi_M^2 + \varpi_{pN-1}^2} \end{bmatrix} \begin{bmatrix} L_0 \\ \frac{1}{C_0} \\ \frac{1}{C_2} \\ \vdots \\ \frac{1}{C_{N-1}} \end{bmatrix} = \begin{bmatrix} \frac{1}{\varpi_0 C_X} \\ \frac{1}{2\varpi_0 C_X} \\ \vdots \\ \frac{1}{N\varpi_0 C_X} \\ \frac{\alpha R_{CO}}{-1 + \alpha R_{CO}\varpi_M C_X} \end{bmatrix} \quad (4)$$

6. A switching circuit comprising four semiconductor switch elements each having an input terminal, an output terminal, and a common terminal, an output terminal of a first semiconductor switch element out of the four semiconductor switch elements and an output terminal of a third semiconductor switch element out of the four semiconductor switch elements being connected to each other, a common terminal of a second semiconductor switch element out of the four semiconductor switch elements and a common terminal of a fourth semiconductor switch element out of the four semiconductor switch elements being connected to each other, a common terminal of the first semiconductor switch element and an output terminal of the second semiconductor switch element being connected to each other, a common terminal of the third semiconductor switch element and an output terminal of the fourth semiconductor switch element being connected to each other, and a pulse-like signal being applied to each input terminal of the first to fourth semiconductor switch elements such that the second and third semiconductor switch elements are in an OFF state when the first and fourth semiconductor switch elements are in an ON state and the second and third semiconductor switch elements are in an ON state when the first and fourth semiconductor switch elements are in an OFF state, further comprising a capacitance suppression element section connected at least one of between the input terminal and the output terminal, between the input terminal and the common terminal, and between the output terminal and the common terminal of at least one of the four semiconductor switch elements,
wherein the capacitance suppression element section reduces a parasitic capacitance between the terminals of the semiconductor switch element, where the capacitance suppression element section is connected, to less than that obtained when the capacitance suppression element section is not connected, at a frequency N times (N is an integer of 1 or more) as high as a clock frequency of the pulse-like signal,
wherein the pulse-like signal is a PWM signal, and
wherein the capacitance suppression element section is configured to satisfy expressions (1) and (2) when a reactance of the capacitance suppression element section is a function $X(\omega)$ of an angular frequency:

[Expression 1]

$$jX(n\varpi_0) = -\frac{1}{jn\varpi_0 C_X}(n = 1, 2, \ldots, N) \quad (1)$$

[Expression 2]

$$\left|\frac{1}{jn\varpi_0 C_X + \frac{1}{jX(\varpi_M)}}\right| = \alpha R_{CO}(\alpha \gg 1) \quad (2)$$

(in the expressions (1) and (2), j represents an imaginary unit, $\omega_0$ represents a product of a clock frequency of the PWM signal and $2\pi$, $\omega_M$ represents a product of a modulation frequency of the PWM signal and $2\pi$, $C_X$ represents a parasitic capacitance between the terminals of the semiconductor switch element as the parasitic capacitance between the terminals of the semiconductor switch element where the capacitance suppression element section is connected, $R_{CO}$ represents an output impedance of a drive circuit that is connected to the input terminal of the semiconductor switch element where the capacitance suppression element section is connected and supplies the PWM signal).

7. The switching circuit according to claim 6, further comprising a first capacitance element connected between the output terminal of the second semiconductor switch element and the input terminal of the fourth semiconductor switch element, and
a second capacitance element connected between the input terminal of the second semiconductor switch element and the output terminal of the fourth semiconductor switch element,
wherein the first capacitance element has a capacitance to reduce a parasitic capacitance between the input terminal and the output terminal of the fourth semiconductor switch element to less than that obtained when the first capacitance element is not connected, at a frequency N times (N is an integer of 1 or more) as high as the clock frequency of the pulse-like signal supplied to the fourth semiconductor switch element, and
the second capacitance element has a capacitance to reduce a parasitic capacitance between the input terminal and the output terminal of the second semiconductor switch element to less than that obtained when the second capacitance element is not connected, at a frequency N times (N is an integer of 1 or more) as high as the clock frequency of the pulse-like signal supplied to the second semiconductor switch element.

8. The switching circuit according to claim 6,
wherein the function $X(\omega)$ is expressed by an expression (3):

[Expression 3]

$$jX(\varpi) = \frac{\beta(-\varpi^2 + \varpi_{z0}^2)(-\varpi^2 + \varpi_{z1}^2) \ldots (-\varpi^2 + \varpi_{zN-1}^2)}{j\omega(-\varpi^2 + \varpi_{p1}^2) \ldots (-\varpi^2 + \varpi_{pN-1}^2)} \quad (3)$$

(in the expression (3), when t is an integer of 1 to N−1, $\omega_{z0}$ is a value that satisfies $0<\omega_{z0}<\omega_0$, $\omega_{zt}$ and $\omega_{pt}$ are values that satisfy $t\omega_0<\omega_{pt}<\omega_{zt}<(t+1)\omega_0$, and $\beta$ is any value).

9. The switching circuit according to claim 8,
wherein the capacitance suppression element section is connected between the input terminal and the output terminal of the semiconductor switch element.

10. The switching circuit according to claim 6,
wherein N is 2 or more,
the capacitance suppression element section has first to N-th circuit sections connected in series,
the first circuit section is composed of an inductance element and a capacitance element connected in series, and
an i-th circuit section (i is an integer of 2 to N) out of the second to N-th circuit sections is composed of an inductance element and a capacitance element connected in parallel.

11. The switching circuit according to claim 10,
wherein when element values of the inductance element and the capacitance element of the first circuit section are respectively $L_0$ and $C_0$, and element values of the inductance element and the capacitance element of the i-th circuit section are respectively $L_{i-1}$ and $C_{i-1}$, the element values of the inductance element and the capacitance element of the first circuit section and an element value of a capacitance element of each of the second to N-th circuit sections satisfy an expression (4), and $L_{i-1}$ is $1/(C_{i-1}(\omega_{p(i-1)})^2)$:

[Expression 4]

$$\begin{bmatrix} \varpi_0 & \frac{-1}{\varpi_0} & \frac{\varpi_0}{-\varpi_0^2 + \varpi_{p1}^2} & \cdots & \frac{\varpi_0}{-\varpi_0^2 + \varpi_{pN-1}^2} \\ N\varpi_0 & \frac{-1}{2\varpi_0} & \frac{2\varpi_0}{-2^2\varpi_0^2 + \varpi_{p1}^2} & \cdots & \frac{2\varpi_0}{-2^2\varpi_0^2 + \varpi_{pN-1}^2} \\ \vdots & \vdots & \vdots & \ddots & \vdots \\ N\varpi_0 & \frac{-1}{N\varpi_0} & \frac{N\varpi_0}{-N^2\varpi_0^2 + \varpi_{p1}^2} & \cdots & \frac{N\varpi_0}{-N^2\varpi_0^2 + \varpi_{pN-1}^2} \\ \varpi_M & \frac{-1}{\varpi_M} & \frac{\varpi_M}{-\varpi_M^2 + \varpi_{p1}^2} & \cdots & \frac{\varpi_M}{-\varpi_M^2 + \varpi_{pN-1}^2} \end{bmatrix} \begin{bmatrix} L_0 \\ \frac{1}{C_0} \\ \frac{1}{C_2} \\ \vdots \\ \frac{1}{C_{N-1}} \end{bmatrix} = \begin{bmatrix} \frac{1}{\varpi_0 C_X} \\ \frac{1}{2\varpi_0 C_X} \\ \vdots \\ \frac{1}{N\varpi_0 C_X} \\ \frac{\alpha R_{CO}}{-1 + \alpha R_{CO}\varpi_M C_X} \end{bmatrix}. \quad (4)$$

\* \* \* \* \*